United States Patent
Sela et al.

(10) Patent No.: US 10,430,328 B2
(45) Date of Patent: Oct. 1, 2019

(54) NON-VOLATILE CACHE AND NON-VOLATILE STORAGE MEDIUM USING SINGLE BIT AND MULTI BIT FLASH MEMORY CELLS OR DIFFERENT PROGRAMMING PARAMETERS

(71) Applicant: SanDisk Technologies Inc., Plano, TX (US)

(72) Inventors: Rotem Sela, Haifa (IL); Miki Sapir, Nes Ziona (IL); Amir Shaharabany, Kochav Yair (IL); Hadas Oshinsky, Kfar Saba (IL); Rafi Abraham, Herzliyya (IL); Elad Baram, Sunnyvale, CA (US)

(73) Assignee: SanDisk Technologies LLC, Plano, TX (US)

( * ) Notice: Subject to any disclaimer, the term of this patent is extended or adjusted under 35 U.S.C. 154(b) by 51 days.

(21) Appl. No.: 14/487,905

(22) Filed: Sep. 16, 2014

(65) Prior Publication Data
US 2016/0077968 A1    Mar. 17, 2016

(51) Int. Cl.
*G06F 3/06* (2006.01)
*G06F 11/14* (2006.01)
(Continued)

(52) U.S. Cl.
CPC ...... *G06F 12/0246* (2013.01); *G06F 12/0871* (2013.01); *G06F 2212/1016* (2013.01);
(Continued)

(58) Field of Classification Search
None
See application file for complete search history.

(56) References Cited

U.S. PATENT DOCUMENTS

| | | | |
|---|---|---|---|
| 8,200,904 B2 * | 6/2012 | Lasser | G06F 12/0884 711/103 |
| 8,479,080 B1 | 7/2013 | Shalvi et al. | |

(Continued)

FOREIGN PATENT DOCUMENTS

WO    WO 2012/166304 A2    12/2012

OTHER PUBLICATIONS

International Search Report corresponding to International Application No. PCT/US2015/046215 dated Oct. 26, 2015; 4 pages.
(Continued)

*Primary Examiner* — Jared I Rutz
*Assistant Examiner* — Marwan Ayash
(74) *Attorney, Agent, or Firm* — Dickinson Wright PLLC

(57) ABSTRACT

Systems and methods for configuring, controlling and operating a non-volatile cache are disclosed. A host system may poll a memory system as to the memory system's configuration of its non-volatile cache. Further, the host system may configure the non-volatile cache on the memory system, such as the size of the non-volatile cache and the type of programming for the non-volatile cache (e.g., whether the non-volatile cache is programmed according to SLC or the type of TRIM used to program cells in the non-volatile cache). Moreover, responsive to a command from the host to size the non-volatile cache, the memory system may over or under provision the cache. Further, the host may control operation of the non-volatile cache, such as by sending selective flush commands.

19 Claims, 26 Drawing Sheets

(51) Int. Cl.
  *G06F 12/00*   (2006.01)
  *G06F 17/30*   (2006.01)
  *G06F 12/02*   (2006.01)
  *G06F 12/0871*  (2016.01)

(52) U.S. Cl.
  CPC ........... *G06F 2212/1036* (2013.01); *G06F 2212/214* (2013.01); *G06F 2212/222* (2013.01); *G06F 2212/284* (2013.01); *G06F 2212/313* (2013.01); *G06F 2212/601* (2013.01); *G06F 2212/7203* (2013.01); *G06F 2212/7204* (2013.01); *G06F 2212/7205* (2013.01); *G06F 2212/7206* (2013.01); *G06F 2212/7208* (2013.01); *G11C 2211/5641* (2013.01)

(56) References Cited

U.S. PATENT DOCUMENTS

| | | | | |
|---|---|---|---|---|
| 2007/0268745 | A1* | 11/2007 | Lasser | G11C 11/5628 365/185.01 |
| 2009/0157974 | A1 | 6/2009 | Lasser | |
| 2010/0223423 | A1 | 9/2010 | Sinclair et al. | |
| 2011/0066792 | A1 | 3/2011 | Shaeffer et al. | |
| 2011/0153911 | A1 | 6/2011 | Sprouse et al. | |
| 2012/0311293 | A1* | 12/2012 | Nemazie | G11C 16/0483 711/171 |
| 2013/0132638 | A1* | 5/2013 | Horn | G06F 12/0871 711/103 |
| 2013/0191601 | A1* | 7/2013 | Peterson | G06F 12/0868 711/137 |
| 2014/0157086 | A1* | 6/2014 | Sharon | G06F 11/1012 714/773 |
| 2015/0193299 | A1 | 7/2015 | Hyun et al. | |
| 2015/0193302 | A1 | 7/2015 | Hyun et al. | |

OTHER PUBLICATIONS

Written Opinion of the International Searching Authority corresponding to International Application No. PCT/US2015/046215 dated Oct. 26, 2015; 10 pages.

\* cited by examiner

NON-VOLATILE CACHE AND NON-VOLATILE STORAGE MEDIUM USING SINGLE BIT AND MULTI BIT FLASH MEMORY CELLS OR DIFFERENT PROGRAMMING PARAMETERS

TECHNICAL FIELD

This application relates generally to managing data in a system. More specifically, this application relates to configuring and/or controlling non-volatile cache in a memory device.

BACKGROUND

A memory device may include different storage mechanisms configured for different purposes, such as a long-term storage and a cache. The cache typically is a higher-speed storage than the long-term storage, and may be used to store more commonly accessed data. The cache may be a reserved section of the memory that includes the long-term storage, or may be an independent high-speed storage separate from the memory that includes the long-term storage. One type of cache is non-volatile cache (or NV cache) in which permanent or semi-permanent memory, such as flash memory, is used as the cache.

BRIEF SUMMARY

According to one aspect, a memory device is disclosed. The memory device includes: a memory comprising a non-volatile cache and a non-volatile storage medium; a cache program module configured to program the non-volatile cache according to cache criteria; and a storage medium program module configured to program the non-volatile storage medium according to storage medium criteria, wherein the cache criteria is different from the storage medium criteria.

According to another aspect, a host system is disclosed. The host system includes: an interface configured to communicate with a memory device, the memory device include a non-volatile cache; and processor circuitry in communication with the interface. The processor circuitry includes: a cache configuration module configured to generate a configuration command to configure the non-volatile cache in the memory device; a cache control module configured to generate a control command to control operation of the non-volatile cache in the memory device; and a command transmission module configured to transmit the configuration command and the control command to the memory device.

According to yet another aspect, a memory device is disclosed. The memory device includes: an interface configured to communicate with a host device; a non-volatile memory; and processor circuitry in communication with the interface and the non-volatile memory. The processor circuitry includes: a non-volatile size command module configured to receive a size command via the interface from the host device, the size command indicative of a size of the non-volatile cache; and a non-volatile cache allocation module configured to, in response to receipt of the size command, allocate one or more sections of the non-volatile memory to the non-volatile cache, wherein the one or more sections of the non-volatile memory not being equal to the size as indicated in the size command.

Other features and advantages will become apparent upon review of the following drawings, detailed description and claims. Additionally, other embodiments are disclosed, and each of the embodiments can be used alone or together in combination. The embodiments will now be described with reference to the attached drawings.

BRIEF DESCRIPTION OF THE DRAWINGS

The system may be better understood with reference to the following drawings and description. In the figures, like reference numerals designate corresponding parts throughout the different views.

DETAILED DESCRIPTION

Figure 1A:
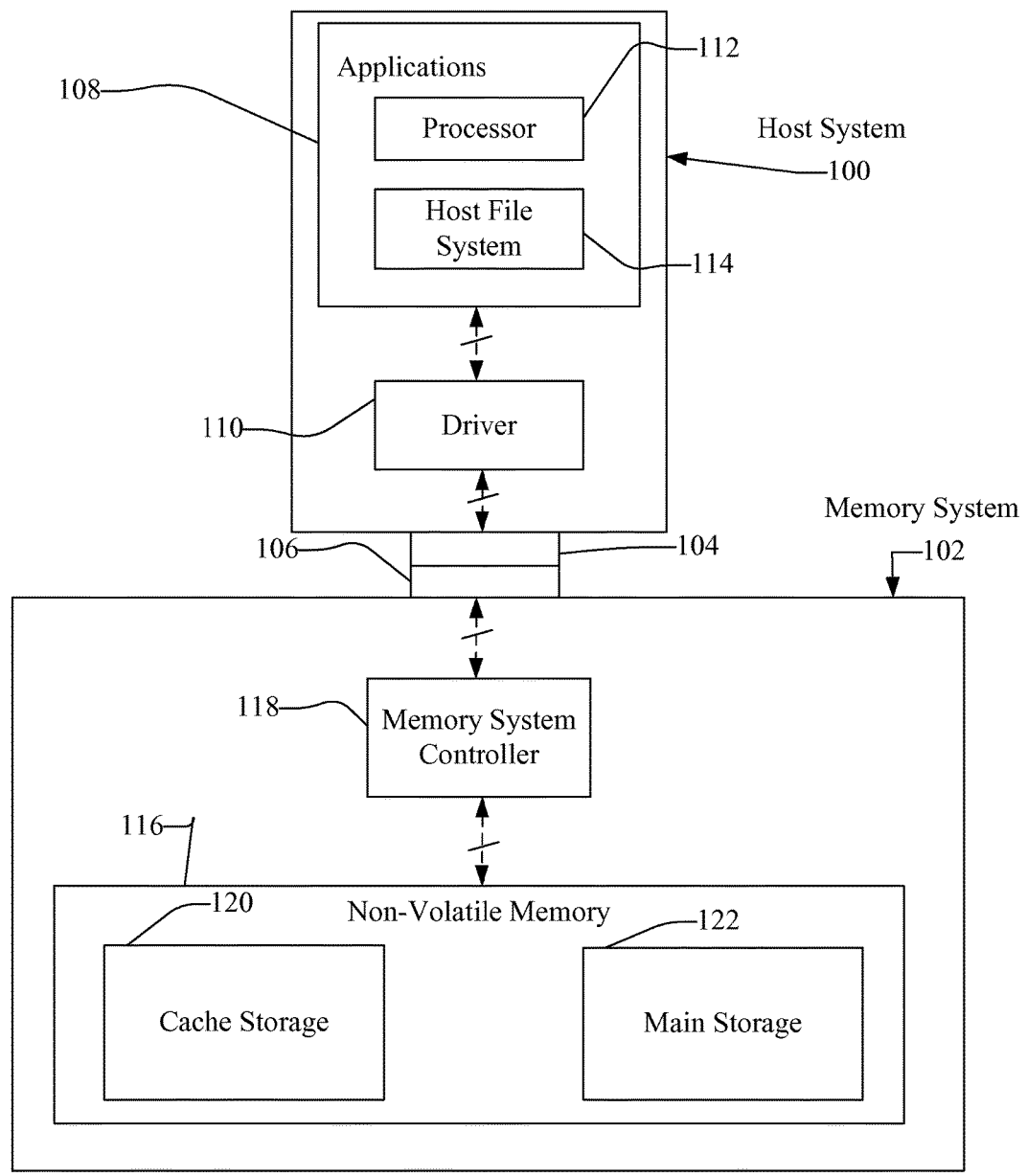
FIG. 1A illustrates a host system connected with a memory system.

As discussed in the background, the memory system may include a non-volatile cache (NV cache). The NV cache may be configured so that programming of the data into and/or reading of the data from the NV cache may be faster than programming/reading data from other non-volatile memory in the memory system. In this regard, use of the NV cache enables a faster access time that is used to enhance write performance. As one example, the memory system may include the NV cache and other memory, such as main storage. The other memory may be different from the NV cache in one or more aspects. In one aspect, the programming procedure of the cells (and/or the reading procedure of reading data from the cells) in the NV cache and the cells in the other memory may be different. In one aspect, the different programming procedures may result in the number of bits per cell programmed and stored in the NV cache being different than the number of bits per cell in the more permanent memory. More specifically, the NV cache may be programmed for single-level cells (SLC), with the cells having two possible states, whereas the more permanent memory may be programmed for multi-level cells (MLC), where the cells have more than two possible states, as discussed in more detail below. Further, the reading of the data from the SLC NV cache is likewise different than the MLC main memory. Programming and reading (sensing) SLC may be quicker, resulting in the performance of the NV cache being quicker than the more permanent memory. In another aspect, the type of programming procedure of NV cache may be different from the more permanent memory. For example, the NV cache may be programmed using a type of TRIM which is faster than the type of TRIM used to program the other memory.

More specifically, the NV cache may be programmed using a first TRIM set which is different from a second TRIM set used to program the other memory (such as the section of memory that corresponds to the exported capacity of the memory system). A TRIM set may include one or more TRIM settings or TRIM parameters, such as a program voltage, a step-up voltage, and/or a program pulse width. Each TRIM set may be associated with different sections of memory, such as one TRIM set for NV cache and another TRIM set for the section of memory that corresponds to the exported capacity of the memory system. When the section of the memory is programmed as part of a write operation, the TRIM settings, such as the program voltage, of the corresponding TRIM set may be used to program the portion of the semiconductor memory. As discussed in more detail below, different TRIM settings or procedures using different parameters for programming the cells, such as disclosed in U.S. Application No. 2014/0157086, incorporated by reference herein in its entirety. In this regard, programming the NV cache may be quicker than programming the more permanent memory.

Further, data written may reside in the NV cache and consolidated in fewer, larger operations. In this regard, the data written may be held in NV cache, improving endurance, where it may be over-written and not affect standard memory endurance.

In one embodiment, the memory system uses configuration data stored in memory system, such as configuration data stored during manufacture of the memory system. For example, the configuration data may comprise data identifying the type of memory cell (e.g., SLC or MLC, such as X2 or X3), the type of programming (e.g., the type of TRIM), the cache unit, or the like.

Alternatively, or in addition, the configuration of the NV cache may be based on one or more commands sent from the host system. Typically, the host system has little control over the NV cache, such as the configuration or the operation of the NV cache. In this instance, the host system may command the configuration of the NV cache. For example, the host system may receive information from the memory system about one or more aspects of the NV cache, such as the cache unit size and/or the adjustment factor/data retention information, discussed in more detail below. In one example, the memory system may send the information about one or more aspects of the NV cache responsive to a poll (e.g., a query) sent from the host system. In another example, the memory system may send the information about one or more aspects of the NV cache without a predicate poll sent from the host system. Responsive to the information sent from the memory system and/or responsive to a trigger event in the host system, the host system may configure one or more aspects of the NV cache. For example, the host system may configure any one, any combination, or all of the following: size of NV cache; type of NV cache (e.g., SLC or MLC); type of programming of the NV cache (e.g., TRIM, discussed in more detail below); when to flush the NV cache (e.g., during idle time or not); and how much to flush (e.g., when reaching a first predetermined fullness in the NV cache, flush the NV cache completely or to a second predetermined fullness).

In yet another embodiment, the host system may control operation of one or more aspects of the NV cache. For example, the host system may control operation of one or both of the following: whether to by-pass NV cache; and selectively flushing the NV cache.

For example, the host system may control when the memory system selectively flushes the NV cache such that the NV cache retains at least part of its data stored therein. In one embodiment, the selective flush command is irrespective of the data stored in the NV cache. In a more specific embodiment, the host system may send a command, such as a configuration command, to instruct the memory system of the NV cache conditions, such as fullness of the NV cache, under which to selectively flush the NV cache. For example, the command may indicate one or more conditions to trigger application of the selective flush, and may indicate one or more conditions to selectively flush the NV cache. In particular, the command may indicate a trigger of a first fullness of the NV cache, such as 80% fullness, and may indicate selective flushing of the cache to a second fullness, such that after flushing the NV cache is at 20% fullness. As another example, the command may solely indicate the one or more conditions to selectively flush the NV cache, such as flushing the NV cache to 20% fullness. In this instance, the host system may actively monitor the fullness level of the NV cache, such as by polling the memory device for the fullness. Responsive to the host system determining that the NV cache has met a predefined threshold, such as 80% fullness, the host system may send the command to the memory system to selectively flush the NV cache.

In an alternate embodiment, the selective flush command is based on least one identifying aspect associated with the data stored in the NV cache. Data stored in the memory system may include one or more identifying aspects, such as an address (e.g., a logical block address (LBA), discussed below). The memory system may store the data along with its associated identifying aspect(s). The host system may send a selective flush command to the memory system, with the selective flush command including the one or more identifying aspects, such as an LBA or an LBA range. In response to receipt of the selective flush command, the memory system may flush only those entries in the NV cache that include the one or more identifying aspects, as discussed in more detail below.

Referring to the figures, FIG. 1A illustrates a host system 100 and a memory system 102. The host system 100 may comprise any type of host device, such as a stationary computer system (e.g., a desktop computer) or a mobile computer system (e.g., a laptop computer, a smartphone, a tablet computer, or the like).

The host system 100 of FIG. 1A may be viewed as having two major parts, insofar as the memory system 102 is concerned, made up of a combination of circuitry and software. They are an applications portion 108 and a driver portion 110 that interfaces with the memory system 102. In a desktop computer, laptop computer, smartphone, tablet computer, for examples, the applications portion 110 may include a processor (e.g., a CPU) 112 running word processing, graphics, control or other popular application software, as well as the file system 114 for managing data on the host system 100. In a camera, cellular telephone or other host system that is primarily dedicated to performing a single set of functions, the applications portion 108 includes the software that operates the camera to take and store pictures, the cellular telephone to make and receive calls, and the like.

The memory system 102 of FIG. 1A may comprise a semiconductor memory device. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory system can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

Referring back to FIG. 1A, the memory system 102 may include non-volatile memory, such as flash memory 116, and a system controller 118 that both interfaces with the host system 100 to which the memory system 102 is connected for passing data back and forth, and controls the flash memory 116. As discussed above, other types of non-volatile memory are contemplated, such as resistive memory, which may be composed of a plurality of resistive memory cells, and ferroelectric memory.

The memory system 102 may take one of several forms. In one form, the memory system 102 may comprise an embedded device. For example, the memory system 102 may comprise a non-volatile memory configured for use as an internal or embedded SSD drive may look similar to the schematic of FIG. 1A, with the primary difference being the location of the memory system 102 internal to the host system 100. An SSD may be in the form of discrete modules that are drop-in replacements for rotating magnetic disk drives. Alternatively, the memory system 102 may be in the form of a card that is removably connected to the host system 100 through mating parts 104 and 106 of a mechanical and electrical connector as illustrated in FIG. 1A.

As discussed above, the memory system 102 of FIG. 1A may comprise a semiconductor memory device and include non-volatile memory, such as one or more memory chips 116, and a memory system controller 118. In an alternate embodiment, the memory system 102 may include both volatile and non-volatile memory.

The host system 100 may communicate with the memory system for multiple purposes. One purpose is for the host system 102 to store data on and/or read data from the memory system. For example, the host system 100 may send data to the memory system 102 for storage on the one or more memory chips 116 of the memory system 102. As another example, the host system 100 may request data from the memory system 102 that is stored on the one or more memory chips 116. When communicating with the memory system, the host system 100 may send logical addresses of data, such as in the form of a range of logical block addresses (LBAs). The memory system controller 118 may then convert the LBAs, in one or more steps, to the actual physical addresses on the memory chips 116. The memory system controller 118 may perform a logical address-to-actual physical address conversion in order to map to the actual physical addresses. For example, the LBAs from the host system 100 may be mapped to memory system internal logical addresses, and the memory system internal logical addresses are mapped to the actual physical addresses. As another example, the LBAs from the host system 100 may be mapped directly to the actual physical addresses.

FIG. 1A illustrates that the non-volatile memory 116 includes a non-volatile cache storage 120 and a main storage 122. As discussed in more detail below, the non-volatile cache storage 120 and a main storage 122 may be resident in a same block, resident in different blocks, resident on a same memory chip, or resident on different memory chips.

Figure 1B:
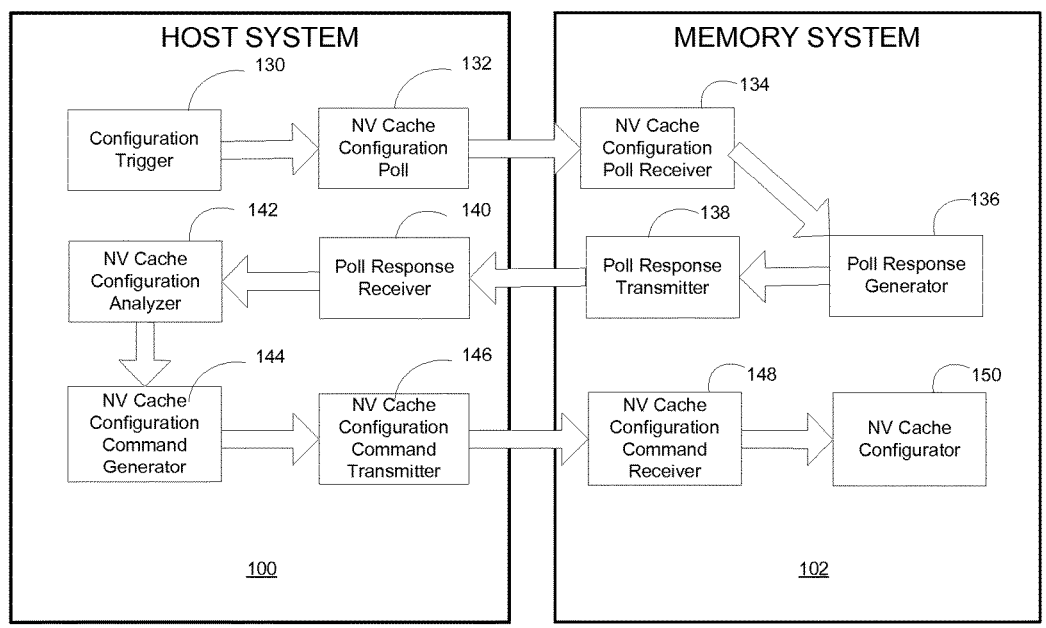
FIG. 1B illustrates another block diagram of the host system and the memory system of FIG. 1A.

FIG. 1B illustrates another block diagram of the host system 100 and the memory system 102 of FIG. 1A. As shown in FIG. 1B, in one embodiment, the host system 100 may configure the NV cache of the memory system 102. To that end, the host system 100 may include a configuration trigger 130, a NV cache configuration poll 132, a poll response receiver 140, a NV cache configuration analyzer 142, a NV cache configuration command generator 144, and a NV cache configuration command transmitter 146. Any one, any combination, or all of the configuration trigger 130, the NV cache configuration poll 132, the poll response receiver 140, the NV cache configuration analyzer 142, the NV cache configuration command generator 144, and the NV cache configuration command transmitter 146 can be implemented as software, hardware, or a combination of hardware and software.

The memory system may include a NV cache configuration poll receiver 134, a poll response generator 136, a poll response transmitter 138, a NV cache configuration command receiver 148, and a NV cache configurator 150. Any one, any combination, or all of the NV cache configuration poll receiver 134, the poll response generator 136, a poll response transmitter 138, the NV cache configuration command receiver 148, and the NV cache configurator 150 can be implemented as software, hardware, or a combination of hardware and software.

The configuration trigger 130 may comprise the trigger for configuration of the NV cache. The trigger may occur at various stages of interaction of the host system 100 and the memory system 102. In one embodiment, the trigger may occur at integration of the memory system 102 with the host system 100. More specifically, the initial electrical connection of the memory system 102 with the host system 100 may trigger the host device 100 to configure the memory system 102. In this regard, the trigger may be static (e.g., one time) regardless of operation of the host system 100 and/or the memory system 102. In an alternate embodiment, the trigger for configuration may be dynamic based on operation of the host system 100 and/or the memory system 102. More specifically, the host system 100 may trigger configuration when the host system seeks to increase the size of the NV cache, thereby improving performance of the memory system at the expense of data capacity of the memory system 100. For example, a camera application executed on the host system 100 may determine a need for an increase in the NV cache, such as due to a burst of pictures being taken. As another example, the host system 100 may trigger configuration when the host system determines a need for more storage on the memory system 102. In response thereto, the host system 102 may seek to decrease the size of the NV cache, thereby improving storage capacity on the memory system 102. In still an alternate embodiment, the host system 100 may trigger configuration at predetermined times.

In response to the trigger, the NV cache configuration poll 132 may generate a poll to send to the memory system 102. The NV cache configuration poll receiver 134 may response the poll and transmit a request to the poll response generator 136. After generation of the poll response, the poll response transmitter 138 may transmit the poll response to the host system 100.

The poll response may comprise one or more aspects of the NV cache. As one example, the poll response may include the NV cache unit size, which represents the unit size of the NV cache. A format for the poll response may comprise:

NV_Cache_Unit_Size (R) (EXT_CSD[xxx])

where (R) indicates that the host may read only, and where EXT_CSD is Extended CSD register in the eMMC standard, which may define the memory system properties, such as the memory card properties, and selected modes. For example, the NV cache unit size may equal 4 kB× $2^{NV\_Cache\_Unit\_Size}$. For simplicity and to send less data, only the NV_Cache_Unit_Size is sent. In particular, for NV_Cache_Unit_Size=2, the NV cache unit size=16 kB.

As discussed above, the NV cache may be configured differently than main memory. In the case of flash memory, NV cache may be configured differently based on the number of bits programmed per cell and/or the type of programming procedure of the cell. With regard to the number of bits per cell, flash memory generally provides highest performance when the number of data bits per cell is lowest, such as binary flash, also known as single level cell (SLC) flash that stores one bit per cell. Flash memory that is configured to store more than one bit per cell, known as multi-level cell (MLC) flash, can store two or more bits of information per cell. While SLC flash memory is generally known for having better read and write performance (e.g., speed and endurance) than MLC flash, MLC flash provides more storage capacity and is generally less expensive to produce. The endurance and performance of MLC flash tends to decrease as the number of bits per cell of a given MLC configuration increases.

With regard to the type of programming, MLC may be programmed in different ways, such as different TRIM types. For example, a first TRIM type may include a first set of one or more programming parameters (e.g., one or more programming pulses, one or more verify levels, etc.). The first TRIM type may program quicker than a second TRIM type (e.g., with a different one or more programming parameters), but may not hold the charge in the cell as long as the second TRIM type.

In this regard, one manner in which to configure the NV cache differently from main memory is to have NV cache as SLC and main memory as MLC. In one embodiment, the memory system 102 consistently configures a single block for one storage capacity. Thus, a single block may be configured for either SLC or MLC, but not both.

Given this, the host system may examine the NV cache unit size to determine whether a block will be underutilized. For example, the NV cache unit size may represent the size of an SLC block. From a utilization standpoint, the NV cache unit size is optimal. As another example, the NV cache unit size may be less than the size of an SLC block. From a utilization standpoint, the NV cache unit size may be less optimal.

More specifically, the poll response may indicate NV_Cache_Unit_Size to be 4 KB while the SLC block is 1 MB. Since the block is configured either entirely as SLC or entirely as MLC (e.g., X3 with 3 bits per cell), if the memory system designates the block as an SLC block for NV cache, the memory system uses the remainder of the block (1 MB-4 kB) as SLC. This would mean that the remainder of the block could store only 1 MB-4 kB bytes of data instead of the full potential of 3x1 MB-4 kB bytes of data, where "3x" represents the remainder of the block storing 3 bits per cell.

Thus, in a system where NV_Cache_Unit_Size is smaller than an SLC block, the remainder of the block size may be unused (e.g., unutilized flash) or if the remainder is used as non-cached data, the remainder would be used as an SLC block which would provide increase to device capacity of only ⅓ of the full potential of the memory, in the example of X3.

The poll response may include the NV cache unit size as one of the following:

(i) based on the size of the SLC block (e.g., 4 KB while the SLC block is 1 MB).

(ii) based on the size of the SLC block multiplied by number of dies. For example, 1 kB while the SLC block is 1 MB and the number of dies is 4, thereby equaling 4 kB. In this regard, when the host system is writing to the NV cache, the memory system may write in parallel across all dies. This is in contrast to a memory system in which the NV_Cache_Unit_Size is not a multiple of number of dies. As another example, the poll response may report NV_Cache_Unit_Size to be 1 KB while the SLC block is 1 MB and number of dies is 4. If the host system decides to parallel program across the 4 dies, the host system may define the NV cache across the 4 dies, with each utilizing only a ¼ of the full capacity of the SLC block, thereby leading to non-efficient utilization of the memory.

(iii) based on MLC size multiplied by number of dies (iv) based on MLC block, if using a different TRIM (e.g., a quicker programming procedure) and not different memory type (e.g., not using SLC or MLC).

As discussed above, the poll response may include the NV cache unit size. Alternatively, or in addition, the poll response may include a non-volatile cache adjustment factor, which may be the ratio between the NV cache memory type and the memory type for main memory. A format for the poll response may comprise:

NVCacheAdjFac (EXT_CSD[xxx])

As one example, the NV cache memory type may be SLC (storing 1 bit per cell), whereas the memory type for main memory is X3 (storing 3 bits per cell). In this regard, the adjustment factor is 3. As another example, the NV cache memory type may be X2 (storing 2 bits per cell) whereas the main memory is X3, resulting in an adjustment factor of 1½. As still another example, if the host system configures the size of the NV cache to be 10 units each of 4 MB, and NVCacheAdjFac is 3. The NV cache size is 40 MB (and storage capacity for the memory system is reduced by 3×40 MB). In this regard, the adjustment factor is an indication of how much storage capacity is lost when designating memory for NV cache.

The poll response may further provide an indication of an amount of time in which the data stored in the NV cache is reliable. As discussed above, the NV cache may be programmed with a type of TRIM that is faster, but is less reliable. The memory system may report an indication of an amount of time that the data stored in the NV cache may be relied upon for valid data. The host system may store the indication in order to track an amount of elapsed time since data was sent to the memory system for storage in the cache. More specifically, in response to the host system determining that the elapsed time is approaching the amount of time the data stored in the NV cache may be relied upon for valid data, the host system may send a command to the memory system to move the data from the NV cache to main storage.

Referring back to FIG. 1B, the poll response receiver 140 receives the poll response. The NV cache configuration analyzer 142 may determine the configuration of the NV cache, such as based on the poll response. In response to determining the configuration of the NV cache, the NV cache configuration command generator 144 generates the configuration command, which is sent by the NV cache configuration command transmitter 146.

The NV cache configuration command receiver 148 of the memory system 102 receives the configuration command. In response to receipt, the NV cache configurator 150 may configure the NV cache. In one example, the configuration of the NV cache may comprise writing or updating parameters associated with the NV cache.

The NV cache configuration command may configure various aspects of the NV cache including any one, any combination, or all of the following: size of the NV cache; the number of bits per cell to configure the memory assigned to the NV cache (e.g., configure as SLC, X2, or X3); the type of programming (e.g., the type of TRIM); when to flush NV cache; etc.

For example, the NV cache configuration command may configure the size of the NV cache. In one embodiment, the NV cache configuration command may indicate the size of the NV cache based on units of the NV cache unit size (e.g., NV_Cache_Unit_Size). The format of the NV cache configuration command for the size of the NV cache is as follows:

NV_Cache_Size (R/W) (EXT_CSD[xxx])

where the command may both read (R) an indication of the current size of the NV cache (such as the number of units of the NV_Cache_Unit_Size) from the memory system and write (W) to command the size of the NV cache.

As discussed in more detail below, the host system includes logic to determine the NV cache size. In one embodiment, the host system may command the size of the NV cache sufficient enough to that determined by the host system. In an alternate embodiment, the host system may initially command the size of the NV cache sufficient to be less than that determined by the host system. In one instance of under-provisioning, subsequent modification of the size of the NV cache may be determined by the memory device based on parameters commanded by the host system. As one example, the host system may instruct the memory system one or more parameters to trigger the memory device to determine when to allocate more/less memory to NV cache. As another example, the host system may instruct the memory system to monitor the fullness of the NV cache before the memory system allocates more/fewer memory (e.g., if the fullness percentage of the NV cache exceeds an upper threshold, allocate more; or if the fullness percentage is less than lower threshold, allocate less)

In another instance of under-provisioning, subsequent modification of the size of the NV cache may be determined by the host system. More specifically, the host system may monitor the fullness of NV cache in order for the host system to determine whether to instruct the memory device to allocate more/fewer blocks to the NV cache.

As another example, the NV cache configuration command may configure the type of memory cell, such as SLC or MLC (e.g., X2 or X3). Configuring the NV cache with a lower bit per cell results in loss of storage capacity. For example, if a 1 MB block of memory is initially designated as X3, and if the host system commands that the block be designated as SLC for the NV cache, the total amount of storage capacity decreases by 3 MB. In this regard, the amount of storage capacity available in the memory system decreases when the NV cache is configured with a lower bit per cell than originally provisioned. In order for the host system to account for the lower storage capacity on the memory system, the host system may: (1) reformat the memory system to indicate an updated exported capacity (see FIG. 1D); or (2) may insert a dummy file into the file system, with the dummy file accounting for the loss in storage capacity. In this way, the File System will be formatted with the original capacity but no access would be done to the dummy file, hence the LBAs outside the new reduced capacity would not be accessed.

As still another example, the host system may instruct the memory device to program the NV cache with a particular type of TRIM. As discussed above, different types of TRIM are available. Certain types of TRIM may be more desirable for the NV cache due to the quicker programming of the MLC; however, these types of TRIM may suffer from data retention issues.

As yet another example of an NV cache configuration command, the host system may instruct the memory system when to flush NV cache. An example of the command is as follows:

NV_Flush_BKOP.

The command is an indication to the memory system to either enable or disable the memory system to move data from the NV Cache to the main memory while the memory system is at idle time. In this regard, with NV_Flush_BKOP, the memory system may perform the same operations as the NV_Flush Command, discussed below, such as relocating data from SLC blocks in NV cache to TLC/MLC main storage blocks or relocate from blocks with NV_Cache_T-RIM (e.g., programmed with a TRIM that may suffer from data retention issues) to blocks with a different TRIM (e.g., programmed with a TRIM that has more reliable data retention).

Still another example of a configuration command is one or more thresholds for controlling operation of the NV cache. More specifically, the host system 100 may send NV_Cache Utilization Threshold, which is a threshold that the memory system 102 checks against the fullness of the NV cache. In response to receipt of the threshold, the memory device may mark internally the threshold as a parameter for use when later examining the fullness of the NV cache. In practice, when the memory device determines that the NV cache hits or exceeds the threshold, as indicated by the NV_Cache Utilization Threshold, the memory system may send an indication to the host system as an exception event (e.g., an interrupt).

When the threshold is reached, the memory system 102 may send a notification to the host system 100 indicating that less than the desired free space in the NV cache is available. In response to the notification, the host system 100 may command the memory device 102 to flush part or all the NV Cache in order to guarantee certain amount of free space at NV Cache.

The memory system 102 may track the fullness of the NV cache in one of several ways. In one way, the memory system may use a counter in order to track the fullness. More specifically, the counter may be indicative of the sectors being used in the NV cache. For example, upon each write to the NV cache, the memory system 102 may increment the counter to indicate the number of sectors currently used in the NV cache. Conversely, when the memory system 102 relocates data from the NV cache to main memory, the memory system 102 may decrement the counter to indicate fewer sectors of NV cache in use. When the value of the counter passes the NV_Cache Utilization Threshold, the memory system 102 may return an indication to the host system 100 to indicate an exception event.

Figure 1C:
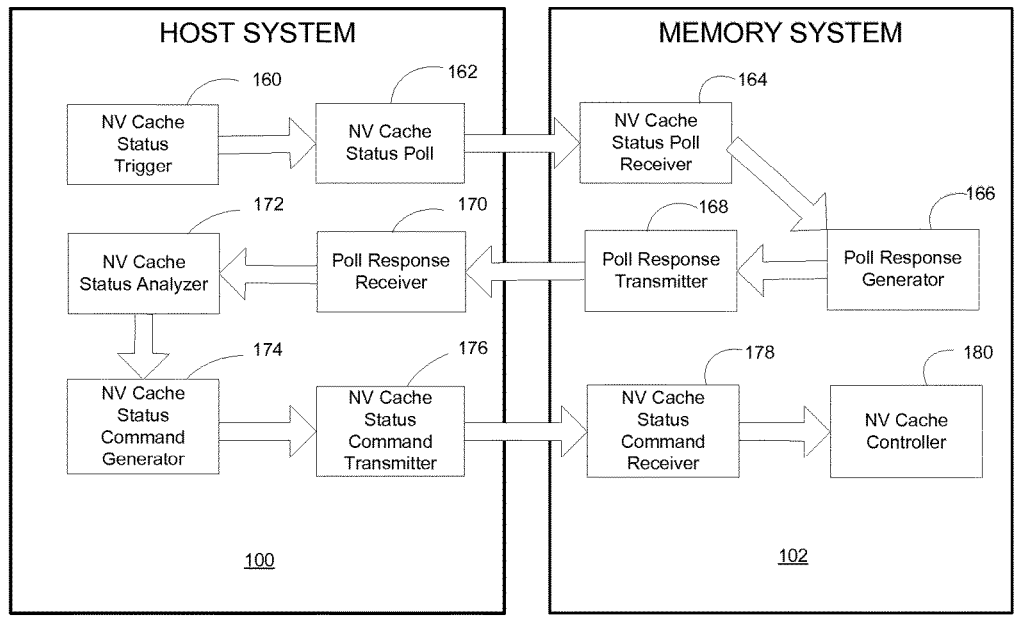
FIG. 1C illustrates yet another block diagram of the host system and the memory system of FIG. 1A.

FIG. 1C illustrates yet another block diagram of the host system 100 and the memory system 102 of FIG. 1A relating to the host system 100 monitoring operation of the NV cache on the memory system 102. NV cache status trigger 160 analyzes one or more activities on the host system 100 and/or the memory system 102 in order to determine whether to trigger a status of the NV cache. In response to the trigger, NV cache status poll 162 generates an NV cache status poll to send to the memory system 102. NV cache status poll receiver 164 receives the NV cache status poll. In response to receipt of the status poll, poll response generator 166 generates a response to the poll, with poll response transmitter 168 transmitting the response to the host system 100.

Poll response receiver 170 receives the poll response. NV cache status analyzer 172 is configured to analyze the poll response. NV cache status command generator 174 is configured to generate a NV cache status command based on the analysis of the poll response. NV cache status command transmitter 176 transmits the NV cache status command to the memory system 102. NV cache status command receiver 178 receives the NV cache status command, which is forwarded to the NV cache controller 180 for implementation.

The host system 100 may send one or more commands to the memory system 102 during operation of the NV cache. One command may include a bypass indicator that is indicative to the memory system 102 to bypass storing the data in the NV cache, and to directly store the data in the main storage (e.g., the storage medium 197 in FIG. 1D). An example of the command comprises a command, such as illustrated below:

SET_BLOCK_COUNT Command (CMD23)/QUEUED_TASK_PARAMS Command (CMD44)

wherein the command may include a parameter bit (bit 22) for NV_Force Programming, which may comprise a bypass indicator. In this regard, the bypass indicator may be included in a write command to the memory system 102, and may include a parameter bit (e.g., NV_Force Programming), such as shown in the following:

| Force Program-ming | NV_Force Program-ming | Description |
|---|---|---|
| 0 | 0 | The memory system writes the logical blocks to volatile cache, non-volatile cache, and/or the main memory. |
| 0 | 1 | The memory system writes the logical blocks to volatile cache, and/or the main memory. |
| 1 | 0 | The memory system writes the logical blocks to non-volatile cache, and/or the main memory. |
| 1 | 1 | The memory system writes the logical blocks to the memory. |

In this regard, when a command is marked with NV_Force Programming set as '0', the memory system may write the data to NV cache.

In another example, during operation of the NV cache, the host system 100 may poll the memory system 102 as to the fullness of the NV cache. The poll may be in the form of an NV Cache Utilization command. In response, the memory system 102 may send a response indicative of an amount that the NV cache is utilized. The response may comprise an amount of free blocks or a percentage of NV cache that is free (or used). The amount of free blocks may also include an indication the type of blocks (e.g., SLC blocks, X2 blocks, or X3 blocks). An example of the values of the response, and the corresponding amounts of NV cache utilization, are illustrated in the table below:

| Value | Description |
|---|---|
| 0x00 | Not defined |
| 0x01 | 10% of NV Cache size is free |
| 0x02 | 20% of NV Cache size if free |
| 0X03 | 30% of NV Cache size if free |
| — | |
| 0xA | 100% of NV Cache size is free |
| Others | Reserved |

As discussed in more detail below, various events may trigger the host system to request the fullness of the NV cache. For example, an application may determine an immediate need for space in the NV cache, thereby prompting the request for the fullness of the NV cache.

In still another example, during operation of the NV cache, the host system 100 may send a selective flush command. The selective flush command may select some, but not all, of the data in the NV cache for migration to main storage. In one embodiment, the selective flush command may indicate a non-zero amount of data that remains in the NV cache after execution by the memory system 102 of the selective flush command. The non-zero amount of data may comprise a percentage of fullness, as discussed in more detail below. In an alternate embodiment, the selective flush command may include one or more identifying aspects associated with data that may be stored in the NV cache, such as an LBA or an LBA range. Responsive to receiving the selective flush command, the memory system 102 may flush only data that has the one or more identifying aspects in the command.

In still an alternate embodiment and in contrast to the selective flush command, the host system may issue a flush command to flush all of the data in the NV cache. The command to fully flush may comprise the following:

NV_FLUSH (W/E_P) (EXT_CSD[32] bit 2)

wherein host system may write to bit 2 of byte 32 of a register to indicate to the memory system to perform a full flush of the NV cache.

Figure 1D:
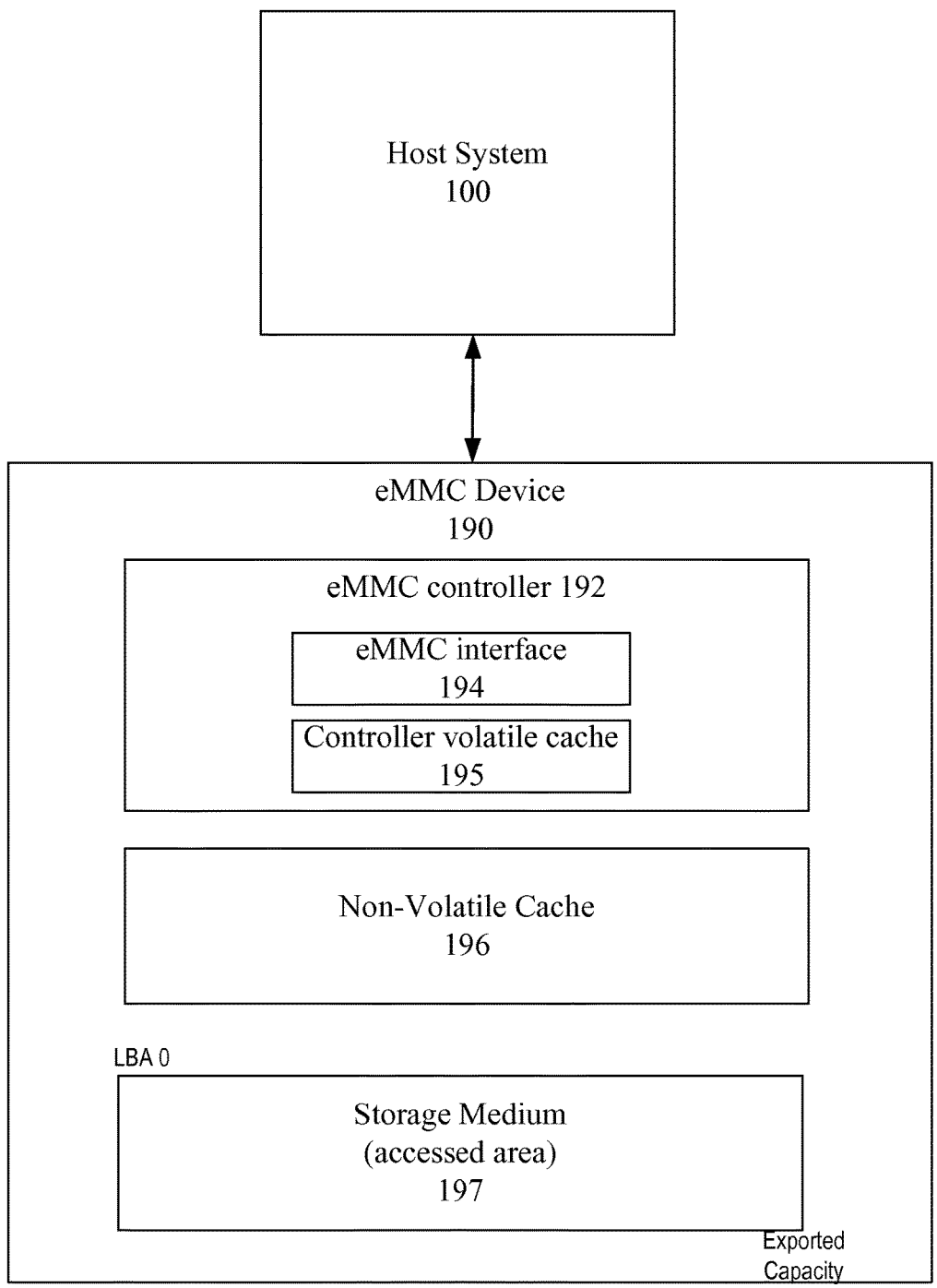
FIG. 1D illustrates a block diagram of the host system and an eMMC memory device.

FIG. 1D illustrates a block diagram of the host system 100 and an eMMC device 190. eMMC stands for embedded Multi-Media Controller, and refers to a device that comprises both a flash memory and a flash memory controller on the same silicon die. As illustrated in FIG. 1D, the eMMC device includes an eMMC controller 192, a non-volatile cache 196, and a storage medium 197. The eMMC controller 192 includes an eMMC interface 194, which is used to interface with host system 100, and controller volatile cache 195, which does not retain data through power cycles.

Non-volatile cache 196 may create an intermediate, transparent, non-volatile storage, using enhanced memory, between the host system 100 and storage medium 197 of the eMMC device 190. More specifically, the non-volatile cache 196 may be partitioned from the flash medium, thereby reducing the overall accessed area. As shown in FIG. 1D, the storage medium 197 includes an LBA range from LBA0 to the exported capacity as its accessed area. The NV Cache command set, discussed herein, enables the host system 100 to manage the non-volatile cache 196. Examples of management of the non-volatile cache 196 include, but are not limited to: determining the NV cache size; receiving indication of NV cache fullness and evacuate (e.g., fully or partially flush) the NV cache to the storage medium 197; and write to NV cache.

Figure 2A:
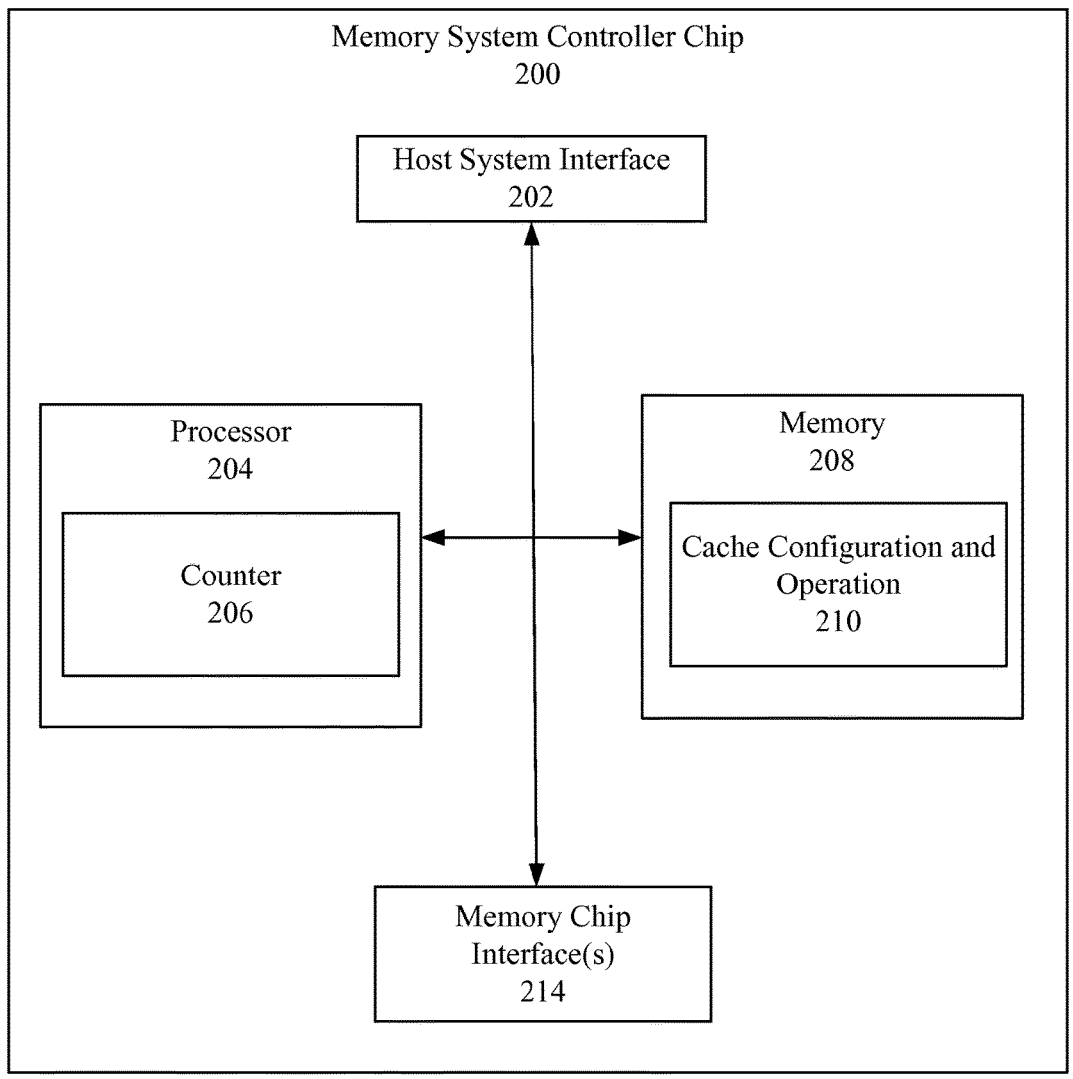
FIG. 2A illustrates memory system controller chip, which is a first example of memory system controller depicted in FIG. 1A.

FIG. 2A illustrates memory system controller chip 200, which is an example of memory system controller 118 depicted in FIG. 1A. As illustrated in FIG. 2A, memory system controller chip 200 includes host system interface 202, which may comprise circuitry and/or software in order to communicate with the host system 100. Alternatively, host system interface 202 may be external to memory system controller chip 200. Memory system controller chip 200 further includes controller 204, memory 208, and memory chip interface(s) 214. Controller 204 includes various functionality, such as counter 206, which may be used to count the number of used sectors in NV cache as discussed above. Memory 208 may include cache configuration and operation 210. Cache configuration and operation 210 may comprise software that is executable by controller 204 to configure and operate the NV cache as discussed herein. Memory chip interface 214 may comprise one or more communication lines configured to communicate with one or more memory chips.

Figure 2B:
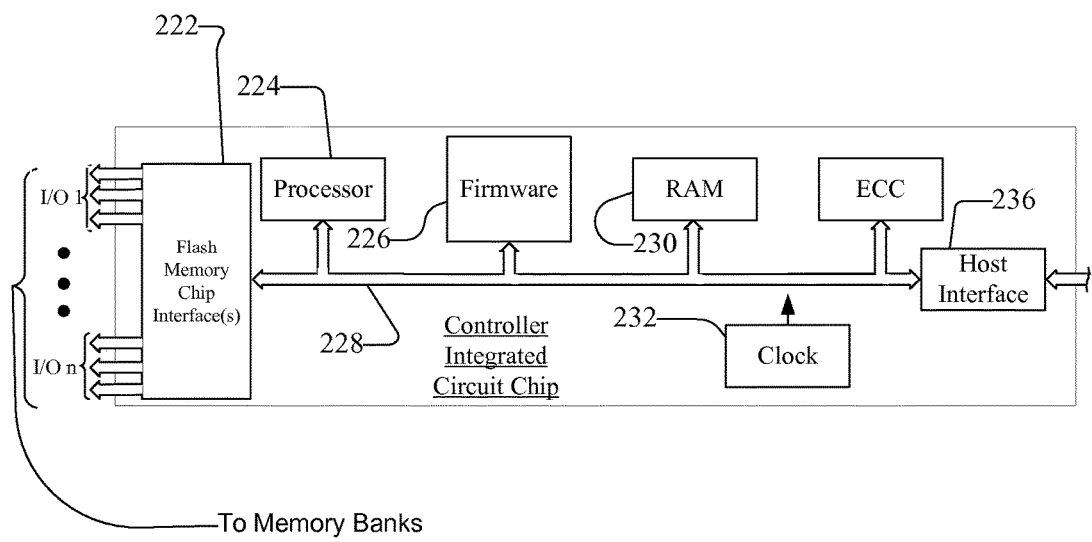
FIG. 2B illustrates memory system controller chip, which is a second example of memory system controller depicted in FIG. 1A.

FIG. 2B illustrates memory system controller chip 220, which is a second example of memory system controller 118 depicted in FIG. 1A. The memory system controller chip 220 may be implemented on a single integrated circuit chip 220, such as an application specific integrated circuit (ASIC), as shown in FIG. 2B. Further, the various functions performed by the memory system controller chip 220 may be performed by a single device, or may be performed by multiple devices, such as shown in FIG. 2B. More specifically, the memory system controller chip 220 may be segmented into the different devices illustrated in FIG. 2B, such as flash memory interface(s) 222, processor 224, RAM 223, ECC 234, host interface 236, and clock 232. FIG. 2B is merely for illustration purposes.

The processor 224 of the memory system controller chip 220 may be configured as a multi-thread processor capable of communicating separately with a respective memory chip via one or more flash memory interface(s) 222. The flash memory interface(s) 222 may have I/O ports for each of the respective memory chips in the flash memory 116. The memory system controller chip 220 may include an internal clock 232. The processor 224 may communicate with an error correction code (ECC) module 234, a RAM buffer 230, a host interface 236, and firmware 226 (which may include boot code ROM) via an internal data bus 228.

Figure 3A:
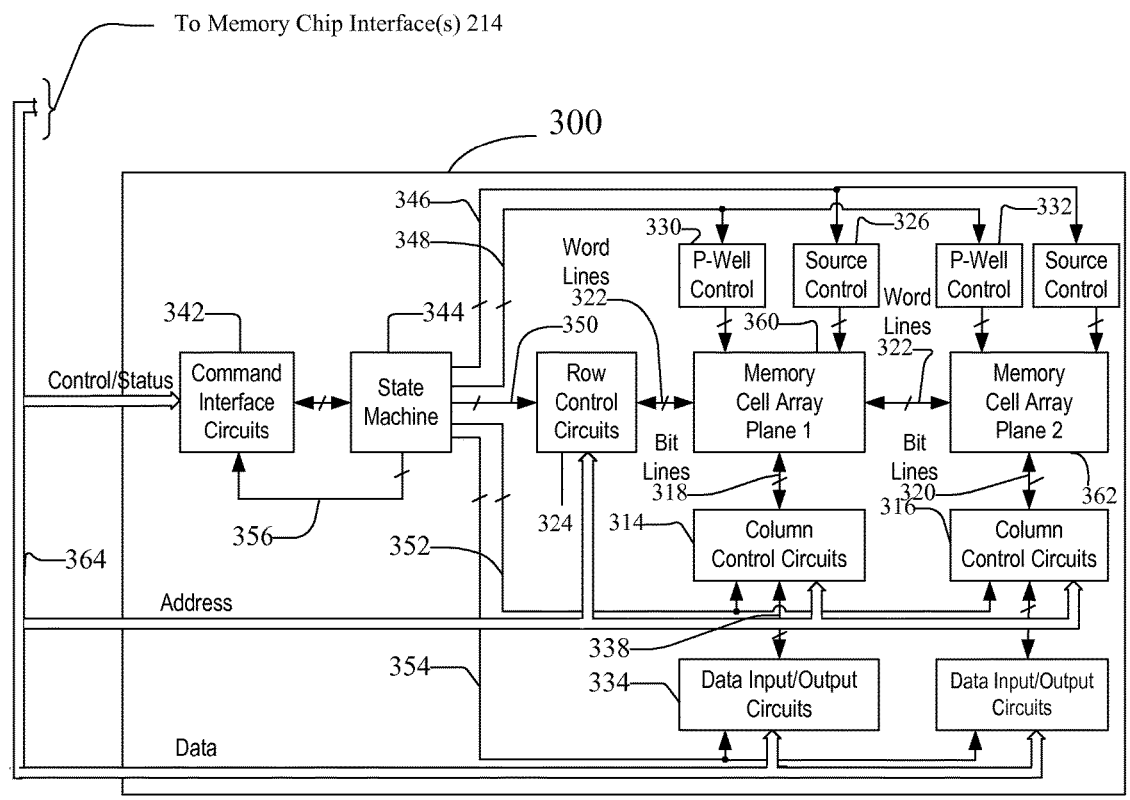
FIG. 3A illustrates an example of a block diagram of a memory chip, such as used in the memory depicted in FIG. 1A.

FIG. 3A illustrates an example of a block diagram of a memory chip 300, such as used in flash memory 116 depicted in FIG. 1A. Each memory chip 300 may contain an array of memory cells organized into multiple planes. FIG. 3A shows planes 360 and 362 for simplicity but a lesser number, such as one plane or a greater number of planes, such as four or eight planes, may instead be used. Alternatively, the memory cell array of a memory bank may not be divided into planes. When so divided, however, each plane has its own column control circuits 314 and 316 that are operable independently of each other. The circuits 314 and 316 receive addresses of their respective memory cell array, and decode them to address a specific one or more of respective bit lines 318 and 320. The word lines 322 are addressed through row control circuits 324 in response to addresses received on the bus 364. Source voltage control circuits 326 and 328 are also connected with the respective planes, as are p-well voltage control circuits 330 and 332. If the bank is in the form of a memory chip with a single array of memory cells, and if two or more such chips exist in the system, data are transferred into and out of the planes 360 and 362 through respective data input/output circuits 334 and 336 that are connected with the bus 364. The circuits 334 and 336 provide for both programming data into the memory cells and for reading data from the memory cells of their respective planes, through lines 338 and 340 connected to the planes through respective column control circuits 314 and 316.

Although the controller 204 in the memory system chip controller 200 controls the operation of the memory chips to program data, read data, erase and attend to various housekeeping matters, each memory chip also contains some controlling circuitry that executes commands from the memory system controller 118 to perform such functions. Interface circuits 342 are connected to the bus 364. Commands from the memory system controller 118 are provided to a state machine 344 that then provides specific control of other circuits in order to execute these commands. State machine 344 may further include error determination functionality, such as discussed herein. Control lines 346-354 connect the state machine 344 with these other circuits as shown in FIG. 3A. Status information from the state machine 344 is communicated over lines 356 to the interface 342 for transmission to the memory system controller 118 over the bus 364.

Figure 3B:
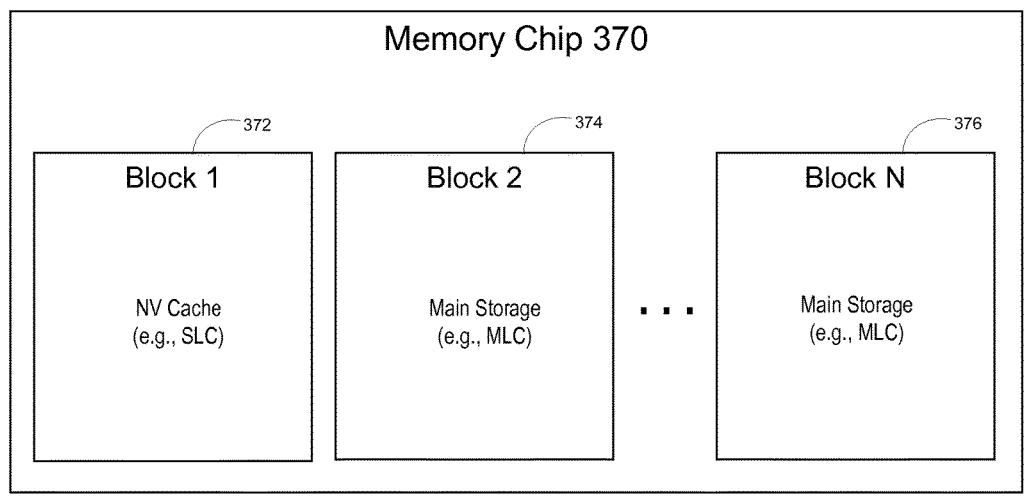
FIG. 3B is one example of NV cache and main storage in a memory chip.
Figure 3C:
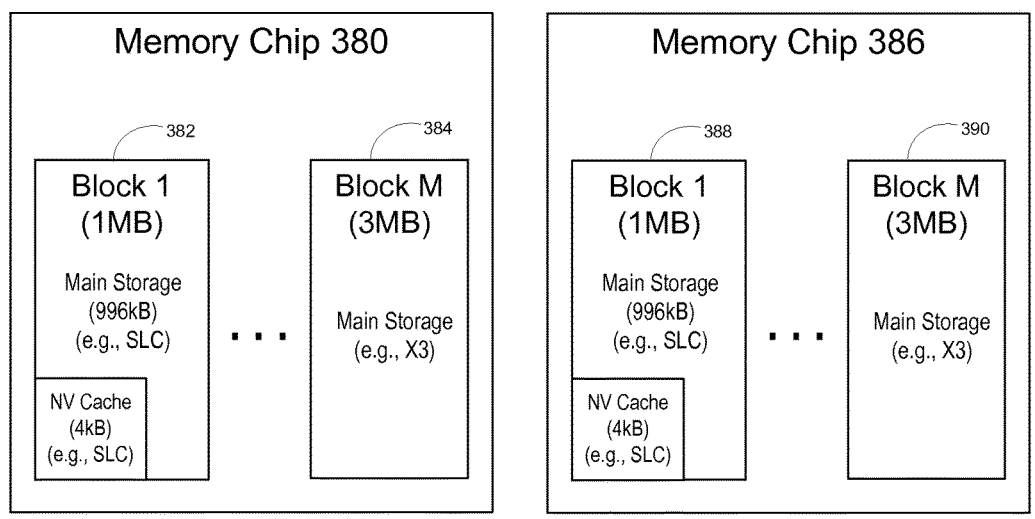
FIG. 3C is another example of NV cache and main storage in multiple memory chips.
Figure 3D:
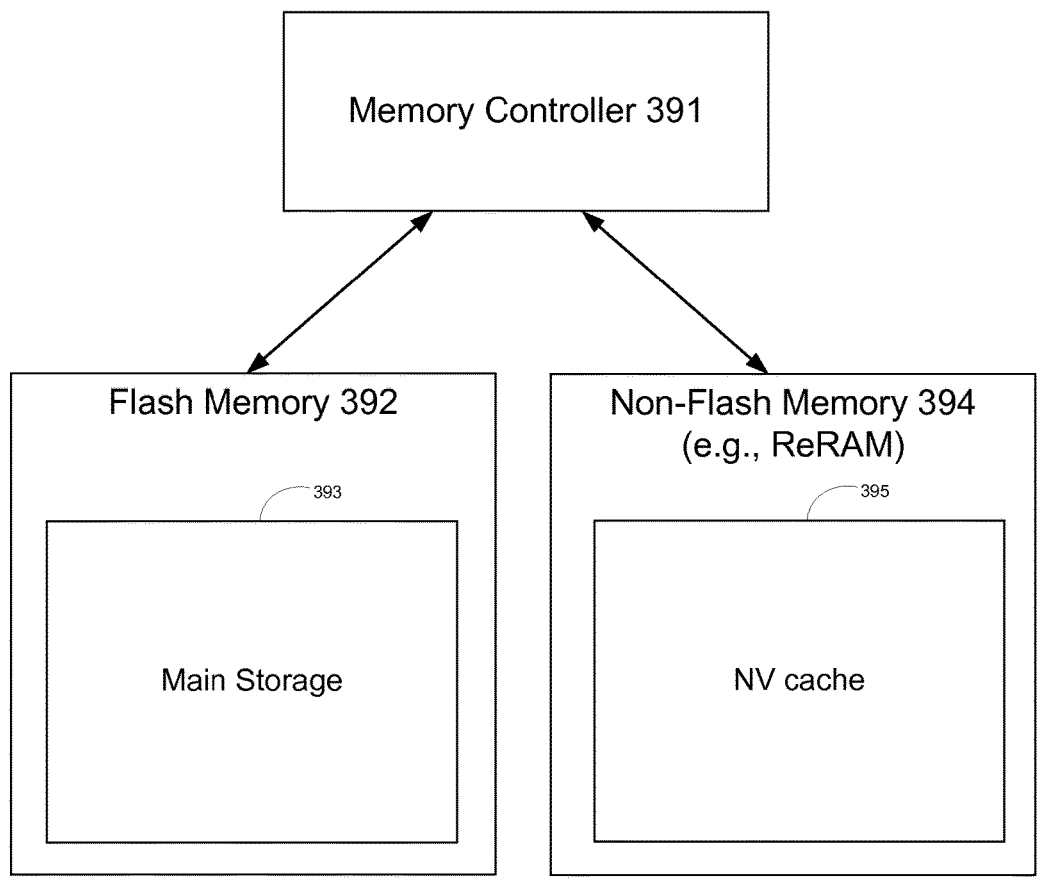
FIG. 3D is yet another example of NV cache and main storage in separate types of memory.

FIGS. 3B-D illustrate different configurations of NV cache within one or more memory chips. FIG. 3B is one example of NV cache and main storage in a memory chip 370. As illustrated in FIG. 3B, the NV cache is in Block 1 (372) and may be SLC. Main storage may be assigned to Block 2 (374) through Block N (376), and may be MLC.

FIG. 3C is another example of NV cache and main storage in multiple memory chips. Memory chip 380 includes Block 1 (382), in which part is NV cache and part is main storage. As illustrated, all of Block 1 (382) is configured as SLC, and stores 1 MB of data. FIG. 3C also illustrates other blocks in memory chip 380, including Block M (384), which is part of main storage. Block M (384) is configured as X3, and stores 3 MB of data. Likewise, memory chip 386 includes Block 1 (388), which includes NV cache and main storage and stores 1 MB of data, and Block M, which stores 3 MB of data.

FIG. 3D is yet another example of main storage 393 and NV cache 395 in separate types of memory. As illustrated, main storage 393 is in flash memory 392 and NV cache 395 is in non-flash memory 394. Non-flash memory 394 may comprise a non-flash based type of memory, such as ReRAM. As illustrated, the main storage 393 is in a separate memory of a separate type than the NV cache 395. FIG. 3D further includes memory controller 391, which may control storage and retrieval from flash memory 392 and non-flash memory 394.

A NAND architecture of the memory cell arrays 360 and 362 is discussed below, although other non-volatile memory architectures or technologies, alone or combination, such as NOR, can be used instead. An example NAND array is illustrated by the circuit diagram of FIG. 4, which is a portion of the memory cell array 360 of the memory bank 300 of FIG. 3A. A large number of global bit lines are provided, only four such lines 402-408 being shown in FIG. 4 for simplicity of explanation. A number of series connected memory cell strings 410-424 are connected between one of these bit lines and a reference potential. Using the memory cell string 414 as representative, a plurality of charge storage memory cells 426-432 are connected in series with select transistors 434 and 436 at either end of the string. When the select transistors of a string are rendered conductive, the string is connected between its bit line and the reference potential. One memory cell within that string is then programmed or read at a time.

Figure 4:
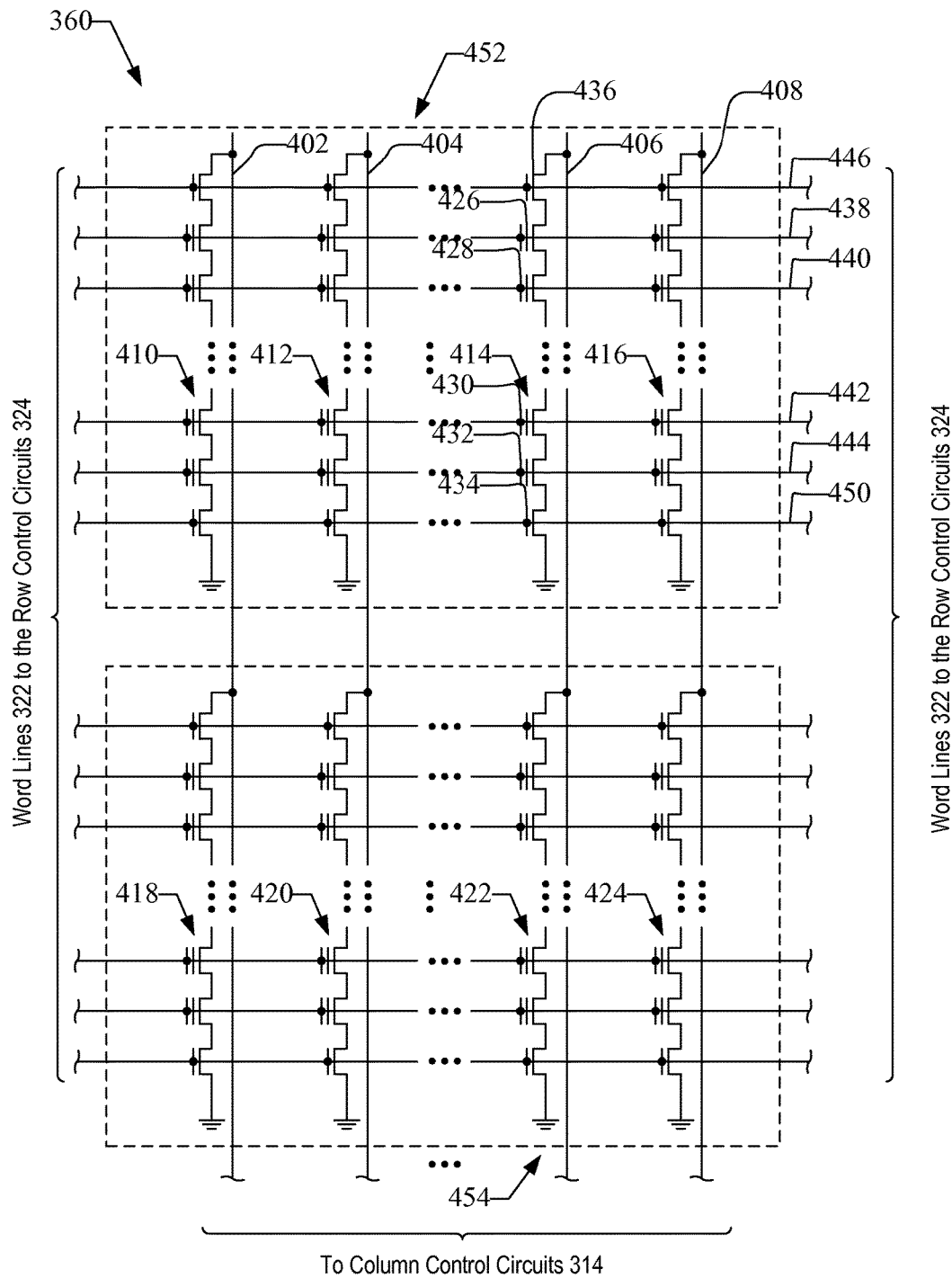
FIG. 4 is a representative circuit diagram of a memory cell array that may be used in the memory bank of FIG. 3A.

Word lines 438-444 of FIG. 4 individually extend across the charge storage element of one memory cell in each of a number of strings of memory cells, and gates 446 and 450 control the states of the select transistors at each end of the strings. The memory cell strings that share common word and control gate lines 438-450 are made to form a block 452 of memory cells that are erased together. This block of cells contains the minimum number of cells that are physically erasable at one time. One row of memory cells, those along one of the word lines 438-444, may be programmed in parallel at a time. Typically, the rows of a NAND array are programmed in a prescribed order, in this case beginning with the row along the word line 444 closest to the end of the strings connected to ground or another common potential. The row of memory cells along the word line 442 is programmed in parallel next, and so on, throughout the block 452. The row along the word line 438 is programmed in parallel last.

A row of memory cells is merely one example of a parallel programming unit. The parallel programming unit may include one or both of the following: (1) all physical structures (such as memory cells) can be programmed/read in parallel; and (2) all physical structures can be programmed/read with the same or similar completion time. Element (2) is for purposes of efficiency, although not required for a parallel programming unit.

The row of memory of memory cells may be composed of cells that are in the same physical location on a die. Alternatively, the row of memory cells may be composed of cells that are in different physical locations on die or dies that are all programmable in parallel. Moreover, other parallel programmable units are contemplated in which memory cells may be programmed in parallel.

A second block 454 is similar, its strings of memory cells being connected to the same global bit lines as the strings in the first block 452 but having a different set of word and control gate lines. The word and control gate lines are driven to their proper operating voltages by the row control circuits 324. If there is more than one plane in the system, such as planes 1 and 2 of FIG. 3A, one memory architecture uses common word lines extending between them. There can alternatively be more than two planes that share common word lines. In other memory architectures, the word lines of individual planes are separately driven.

The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi-level cell (MLC) memory. Both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material.

Figure 5:
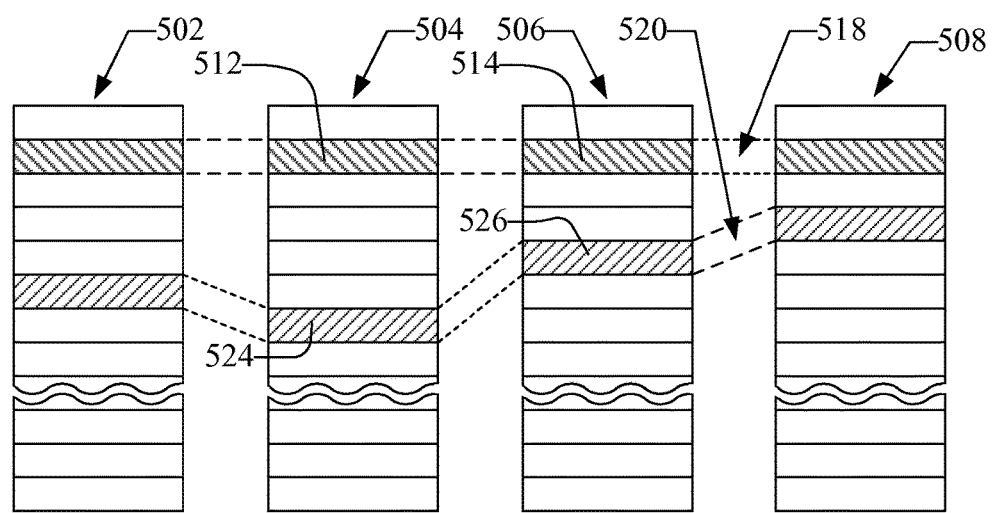
FIG. 5 illustrates an example physical memory organization of the memory bank of FIG. 3A.

FIG. 5 conceptually illustrates an organization of one bank of the multi-bank flash memory that is used as an example in further descriptions below. Four planes 502-508 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into blocks of memory cells shown in FIG. 5 by rectangles, such as blocks 510, 512, 514 and 516, located in respective planes 502-508. There can be hundreds or thousands of blocks in each plane.

As mentioned above, the block of memory cells is the unit of erase, the smallest number of memory cells that are physically erasable together. For increased parallelism, however, the blocks may be operated in larger metablock units. One block from each plane is logically linked together to form a metablock. The four blocks 510-516 are shown to form one metablock 518. All of the cells within a metablock are typically erased together. The blocks used to form a metablock need not be restricted to the same relative locations within their respective planes, as is shown in a second metablock 520 made up of blocks 522-528. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 6:
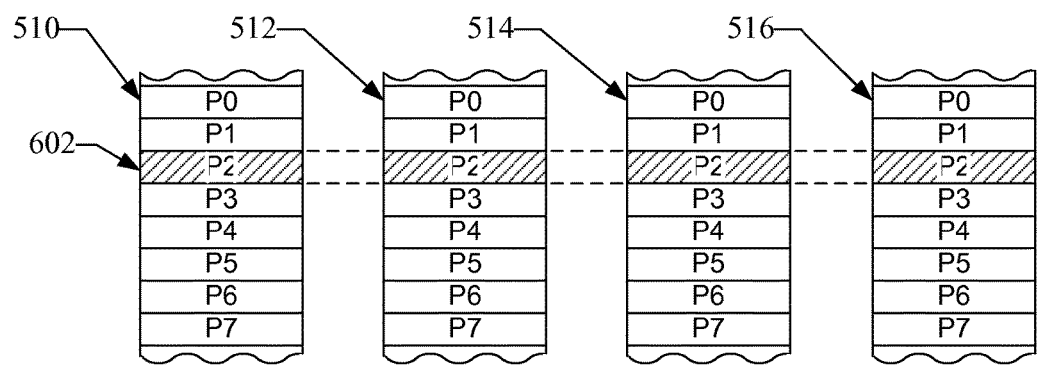
FIG. 6 shows an expanded view of a portion of the physical memory of FIG. 5.

The individual blocks are in turn divided for operational purposes into pages of memory cells, as illustrated in FIG. 6. The memory cells of each of the blocks 510-516, for example, are each divided into eight pages P0-P7. Alternatively, there may be 16, 32 or more pages of memory cells within each block. The page is the unit of data programming within a block, containing the minimum amount of data that are programmed or read at one time. In the NAND architecture of FIG. 3A, a page is formed of memory cells along a word line within a block. However, in order to increase the memory system operational parallelism, such pages within two or more blocks may be logically linked into metapages. A metapage 602 is illustrated in FIG. 6, being formed of one physical page from each of the four blocks 510-516. The metapage 602, for example, includes the page P2 in each of the four blocks but the pages of a metapage need not necessarily have the same relative position within each of the blocks. Within a bank, a metapage is the maximum unit of programming.

Figure 7A:
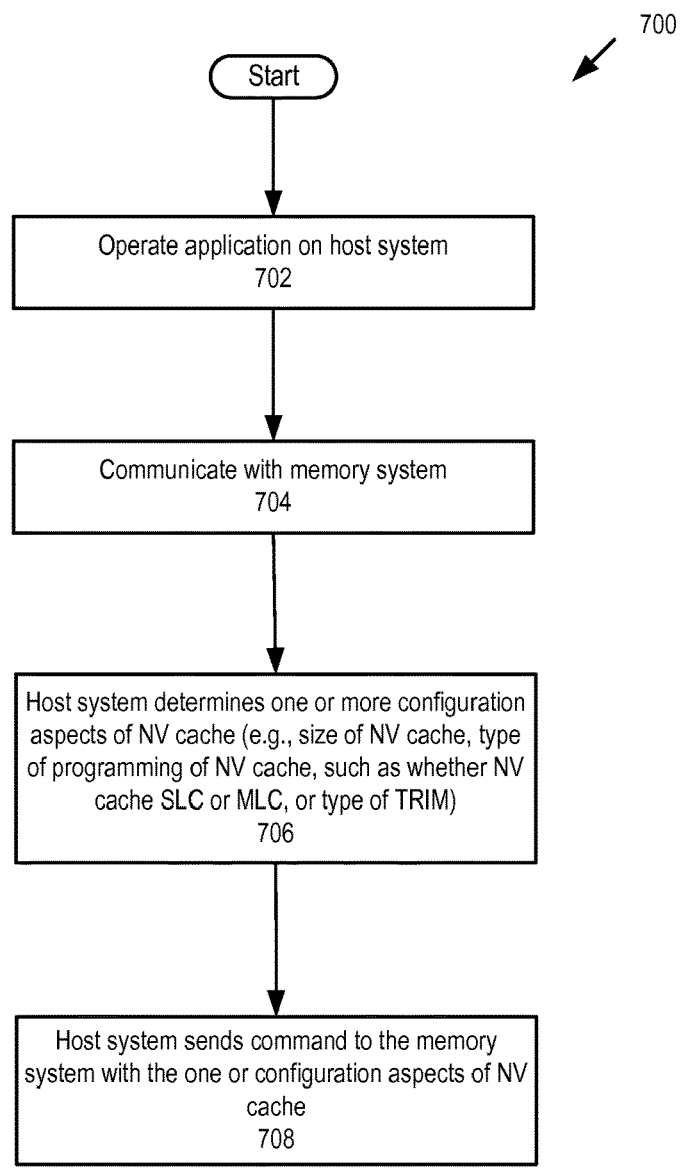
FIG. 7A illustrates a flow chart of an example of the host system configuring the NV cache on the memory system.

FIG. 7A illustrates a flow chart 700 of an example of the host system configuring the NV cache on the memory system. At 702, the host system operates an application. At 704, the host system communicates with the memory system. At 706, the host system configuration aspects of the NV cache, such as the size of the NV cache, type of programming of the NV cache, etc. At 708, the host system sends a command to the memory system with the one or more configuration aspects of the NV cache.

Figure 7B:
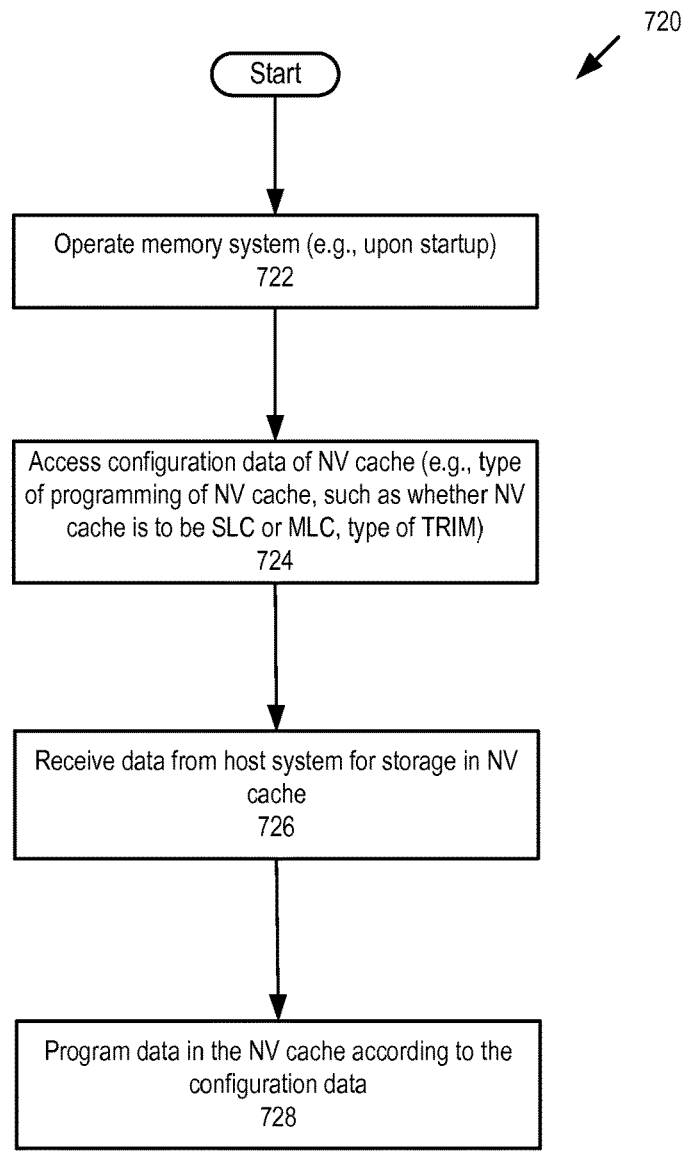
FIG. 7B illustrates a flow chart of an example of the memory system configuring the NV cache on the memory system.

FIG. 7B illustrates a flow chart 720 of an example of the memory system configuring the NV cache on the memory system. At 722, the memory system is operated, such as upon startup. At 724, the memory system accesses configuration data for the NV cache, such as the type of programming of the NV cache. More specifically, the memory system may access the configuration data that was previously programmed into the memory system. At 726, the memory system may receive data from the host system for storage in the NV cache. At 728, the memory system may program the configuration data into the NV cache according to the configuration data.

Figure 8:
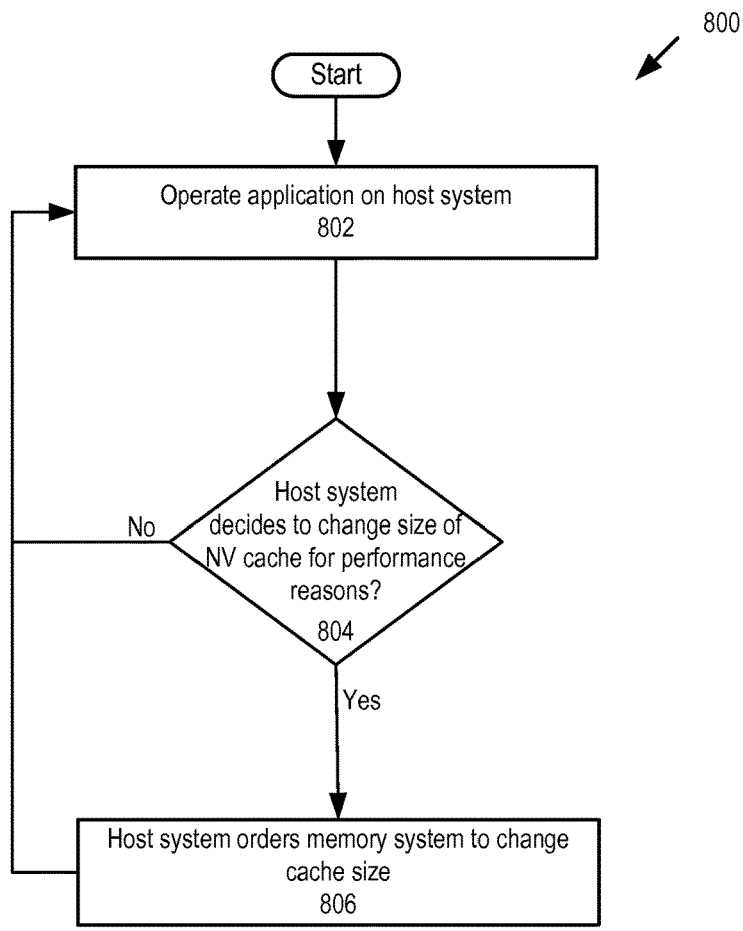
FIG. 8 illustrates a flow chart of an example of the host system configuring a size of the NV cache on the memory system.

FIG. 8 illustrates a flow chart 800 of an example of the host system configuring a size of the NV cache on the memory system. At 802, the host system may operation an application. At 804, the host system decides to change the size of the NV cache for performance reasons. In this regard, FIG. 8 illustrates one trigger, performance reasons, to configure the memory system at various times. For example, the host system may comprise a camera. The camera may operate in burst mode. In response to operating in burst mode in which multiple pictures are taken in rapid succession, the camera may seek to configure the NV cache to increase the size of the NV cache so that the multiple pictures may be stored quickly.

As discussed above, the memory system may execute a selective flush command. The selective flush command may be sent to the memory system during configuration or during operation of the memory system, such as illustrated in FIGS. 9A-E.

Figure 9A:
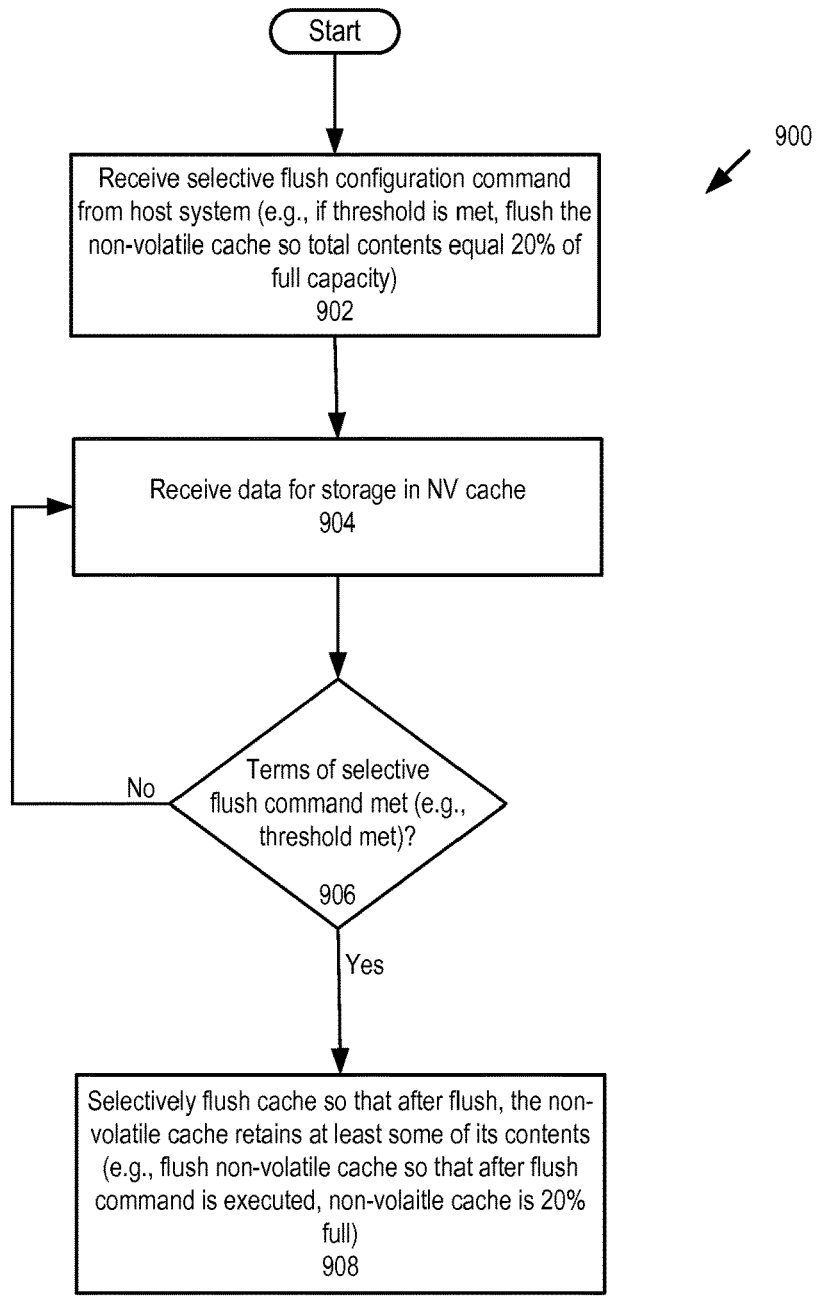
FIG. 9A illustrates a flow chart of a first example of the memory system executing a selective flush command.

FIG. 9A illustrates a flow chart 900 of a first example of the memory system executing a selective flush command in which the selective flush command is sent during configuration. At 902, the memory system receives the selective flush configuration command from the host system. The selective flush configuration command may indicate to the memory system how to partly, but not fully, flush the NV cache. For example, the selective flush configuration command may dictate that when a threshold fullness is met, the memory system flushes the NV cache so that the total contents of the NV cache, after execution of the command, equals a predetermined percentage, such as 20%, of the full capacity of the NV cache.

At 904, the memory system receives data for storage in the NV cache. At 906, the memory system determines whether the terms of the selective flush command, such as the threshold fullness, are met. If yes, at 908, the selective flush command is executed such that after the flush, the NV cache retains at least some of its contents. In the example given, after flushing, the total contents of the NV cache equals the predetermined percentage.

Figure 9B:
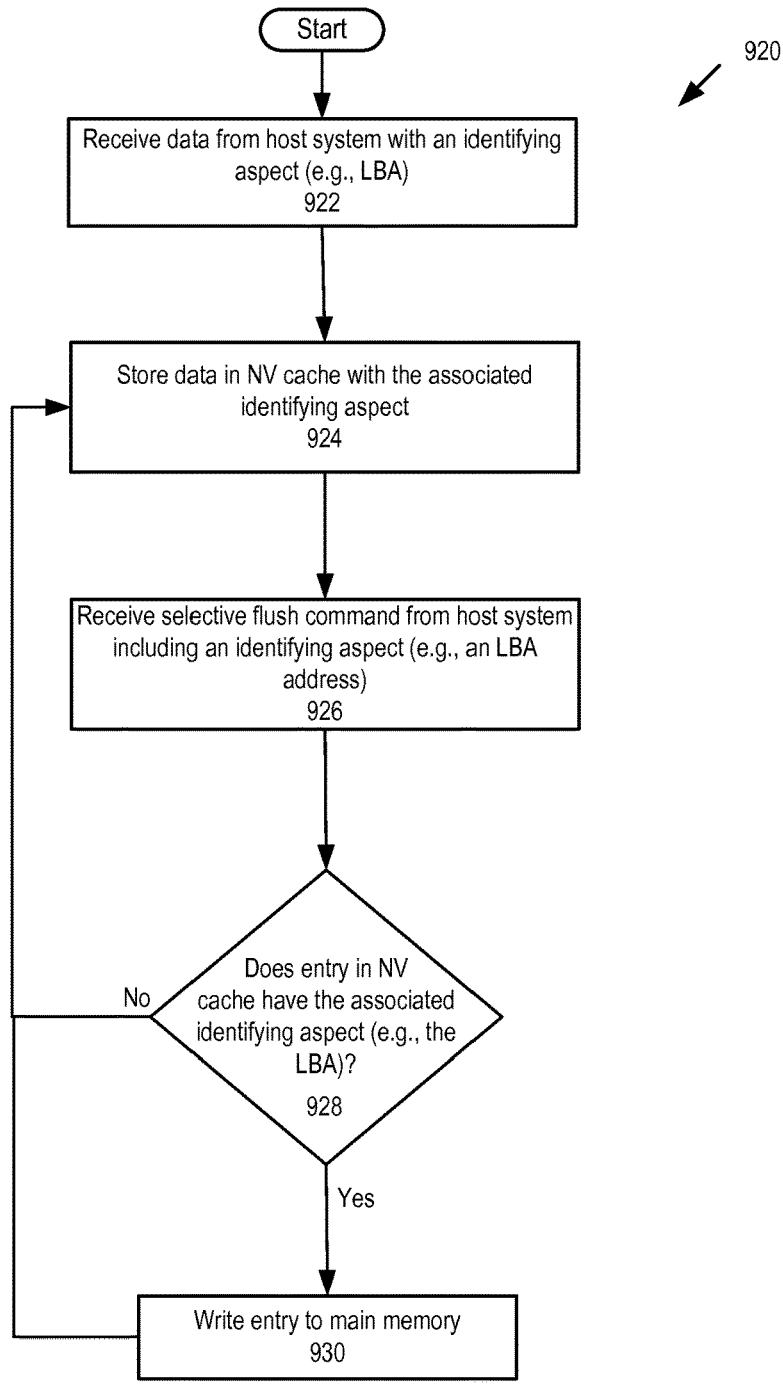
FIG. 9B illustrates a flow chart of a second example of the memory system executing a selective flush command.

FIG. 9B illustrates a flow chart 920 of a second example of the memory system executing a selective flush command in which one or more identifying characteristics of stored data are examined to determine whether to flush the data from the NV cache. At 922, the memory system receives from the host system data for storage, with the data including at least one identifying aspect, such as an LBA. At 924, the memory system stores the data in the NV cache with the associated identifying aspect (e.g., storing the data with its respective LBA). At 926, the memory device receives from the host device the selective flush command. The selective flush command includes an identifying aspect, such as an LBA, which is used to selectively flush data from the NV cache. At 928, the memory system determines whether any of the entries in the NV cache include the identifying aspect in the selective flush command received at 926.

During operation of the NV cache, data in the NV cache may be maintained in the NV cache or may be transferred to main memory. In this regard, when a selective flush command includes an identifying aspect, such as an LBA, the memory device searches the NV cache for entries that match the LBA. If a match is found, at 930, the data entry in the NV cache is written to main memory. If a match is not found, then the data entry has already been written to main memory so that the entry does not need to be flushed.

Further, data in the NV cache may be discarded, thereby avoiding having to flush the data into main memory (and thereafter deleting the data from main memory). The host system may indicate to the memory system to delete data from the NV cache in one of several ways. In one way, the host system may send data that includes the same LBA as data that already resides in the NV cache. As another way, the host system may send a discard command along with an LBA. In response to receiving the discard command, the memory system may search the NV cache for the LBA. In response to a match, the memory system may delete the data associated with the LBA. Alternatively, in response to a match, the memory system may tag the data for discard. The tagging for discard may indicate to the memory system that the data is no longer valid, thereby serving two purposes. First, the discard tag may be used by the memory system to indicate that the data is not to be flushed to main memory (e.g., programmed to X3 using a longer-time TRIM). Second, the discard tag may be used by the memory system to indicate that the data is to be ignored. More specifically, the data tagged for discard may have an LBA of 8885. In the event that the memory system performs a search for LBA 8885 and determines a match, the memory system may note the tag for discard associated with LBA 8885 and ignore the data.

For example, the host system may send a burst of 10 pieces of data (e.g. pictures) to the memory system, each piece of data with an associated LBA. In response to receipt of the 10 pieces of data, the memory system stores the 10 pieces of data in NV cache along with associated LBAs. The host system may command which of those pieces of data are sent to main memory, and which of those pieces of data are discarded. For example, the LBAs for piece of data #2 and piece of data #6 may be LBA1012 and LBA 1016, respectively. The host device may send a selective flush command for the LBAs associated with piece of data #2 and piece of data #6 by sending LBA1012 and LBA 1016. In response to receipt of the flush command, the memory system may search for the associated LBAs, discover that piece of data #2 and piece of data #6 have the associated LBAs, and save piece of data #2 and piece of data #6 to main memory. As another example, the host device may send data along with the same LBAs that were associated with pieces of data already stored in the NV cache. For example, piece of data #1 and piece of data #3 may have corresponding LBA1011 and LBA 1013, respectively. The host system may send a write command with LBA1011 and LBA 1013. In response to receipt of the write command, the memory system may search the NV cache for the LBAs in the write command, determine that the LBAs are the same as are associated with piece of data #1 and piece of data #3, and delete piece of data

1 and piece of data #3 from NV cache, or tag piece of data #1 and piece of data #3 (with the tag indicating to the memory system that piece of data #1 and piece of data #3 will not be copied to main memory during a flush operation).

Figure 9C:
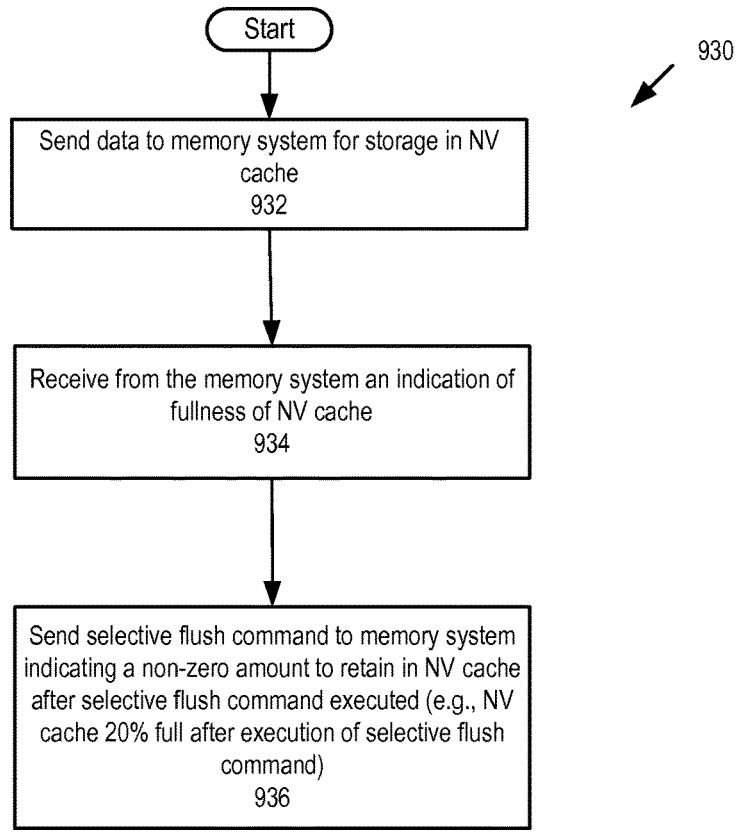
FIG. 9C illustrates a flow chart of a first example of the host system generating and sending a selective flush command.

As discussed above, various triggers may be generated in order to determine whether to send a selective flush command. The trigger may be generated by the memory device or may be generated by the host device. FIG. 9C illustrates a flow chart 930 of a first example of the host system generating and sending a selective flush command in which the trigger is generated by the memory device. At 932, the host system sends data to the memory system for storage in the NV cache. At 934, the host system receives an indication of fullness of the NV cache. As discussed above, the host system may previously have instructed the memory system to indicate to the host system when the NV cache has hit a predetermined threshold of fullness, so that when the NV cache hits the predetermined threshold of fullness, the host system receives the notification. The indication of fullness of the NV cache may act as a trigger to the host device to send a selective flush command. Thus, in response to receipt of the fullness of the NV cache, at 936, the host system sends a selective flush command to the memory system. The selective flush command indicating to the memory system a non-zero amount to retain in the NV cache after execution of the selective flush command.

Figure 9D:
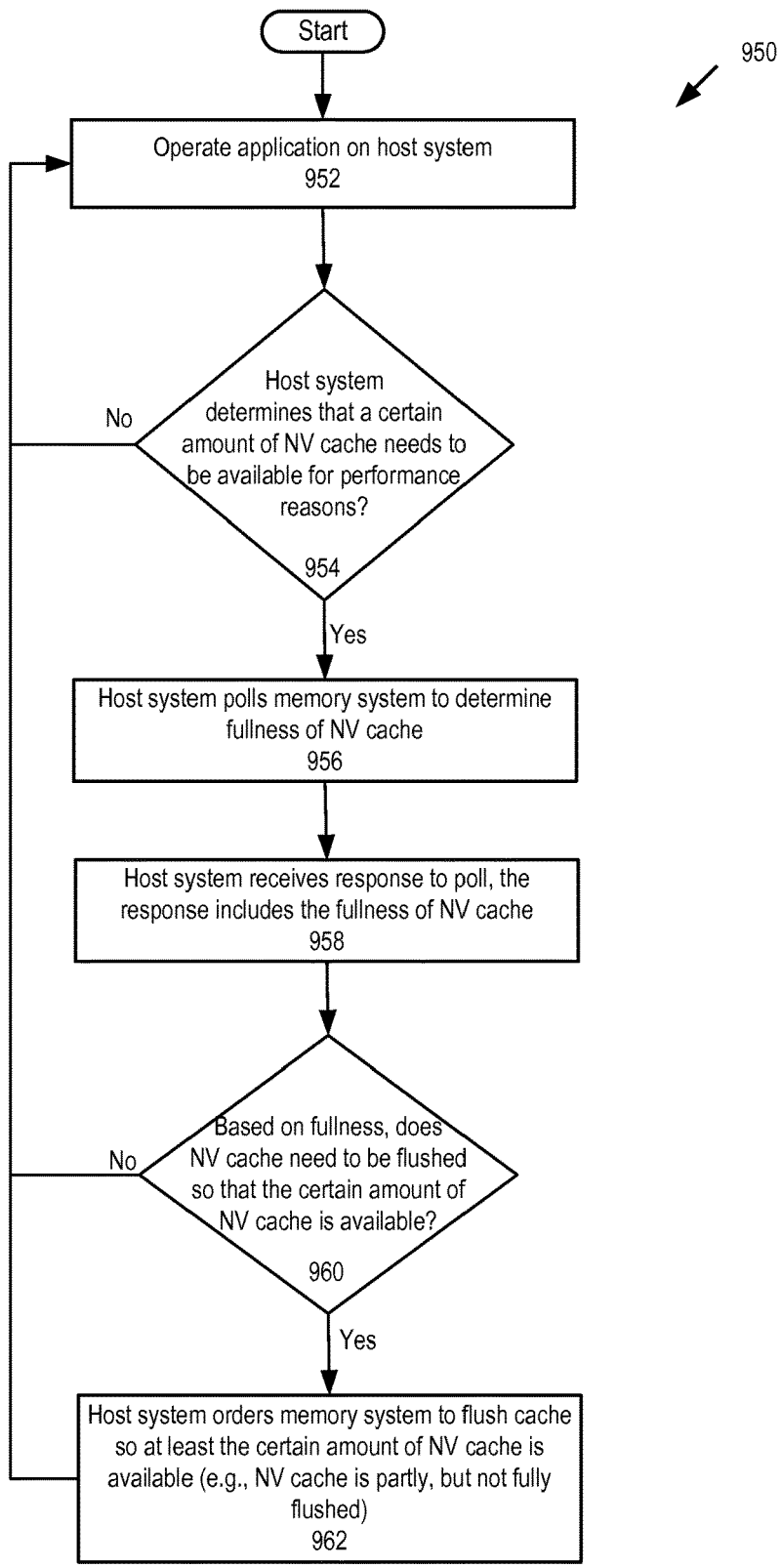
FIG. 9D illustrates a flow chart of a second example of the host system generating and sending a selective flush command.
Figure 9E:
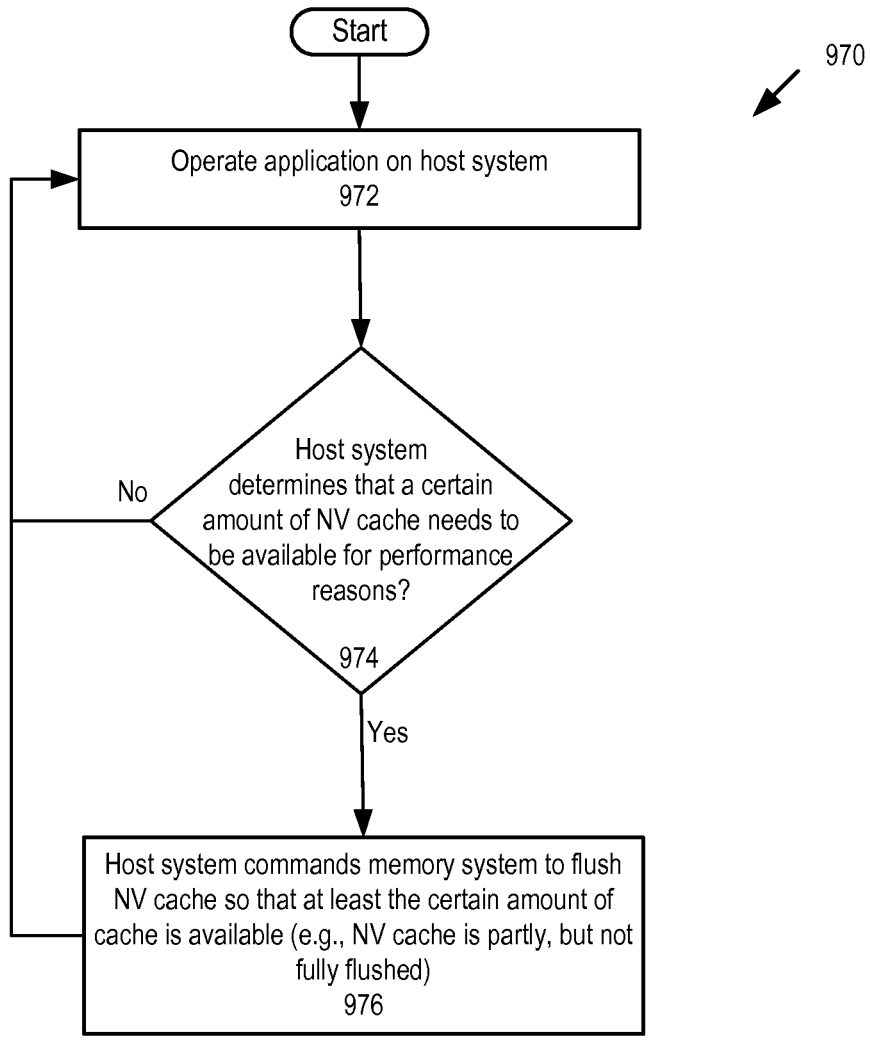
FIG. 9E illustrates a flow chart of a third example of the host system generating and sending a selective flush command.

FIGS. 9D-E illustrate examples in which the host system determines to poll the memory system for fullness of the NV cache. More specifically, FIG. 9D illustrates a flow chart 950 of the host system generating and sending a selective flush command. At 952, the host system operates an application on the host system. At 954, the host system determines that a certain amount of NV cache needs to be available for performance reasons. For example, in a camera application, the host system may determine in the burst mode that at least a certain amount of space in the NV cache should be available. In this regard, the host system, in executing the application, may trigger examining whether the NV cache has sufficient available space.

If the host determines that a certain amount of space in the NV cache is needed, at 956, the host system polls the memory system to determine the fullness of the NV cache. At 958, the host system receives a response to the poll, with the response including the fullness of the NV cache.

At 960, the host system determines, based on the fullness of the NV cache as reported in the response to the poll, whether the NV cache needs to be flushed so that the certain amount of cache needed to operate the application is available. If the host system determines that the NV cache does not have space of the certain amount needed for the application, at 962, the host system orders the memory system to flush the NV cache so that at least the certain amount of NV cache is available.

FIG. 9E illustrates a flow chart 970 of the host system generating and sending a selective flush command. At 972, the host system operates an application on the host system. At 974, similar to 954, the host system determines that a certain amount of NV cache needs to be available for performance reasons. If it is determined that the certain amount of NV cache is needed, at 976, the host system commands the memory system to flush the NV cache so that at least the certain amount of cache space is available. In this regard, in FIG. 9E, the host system instruct the memory system to make the determination as to the sufficiency of available space in the NV cache. This is in contrast to FIG. 9D in which the host system makes the determination as to the sufficiency of available space in the NV cache.

Figure 10A:
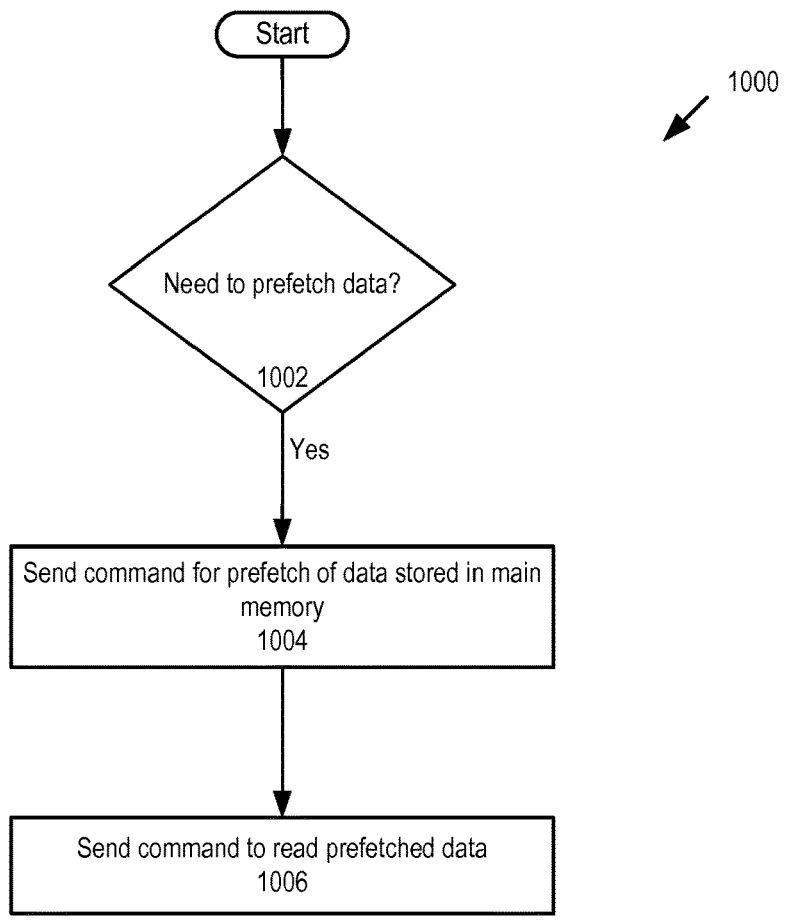
FIG. 10A illustrates a flow chart of an example of the host system controlling a prefetch operation of the NV cache on the memory system.

FIG. 10A illustrates a flow chart 1000 of an example of the host system 100 controlling a prefetch operation of the NV cache on the memory system 102. At 1002, the host system determines whether to prefetch data. If so, the host system sends a command to the memory system to prefetch the data stored in main memory. After sending the prefetch command, at 1006, the host system sends a command to read the prefetched data.

Figure 10B:
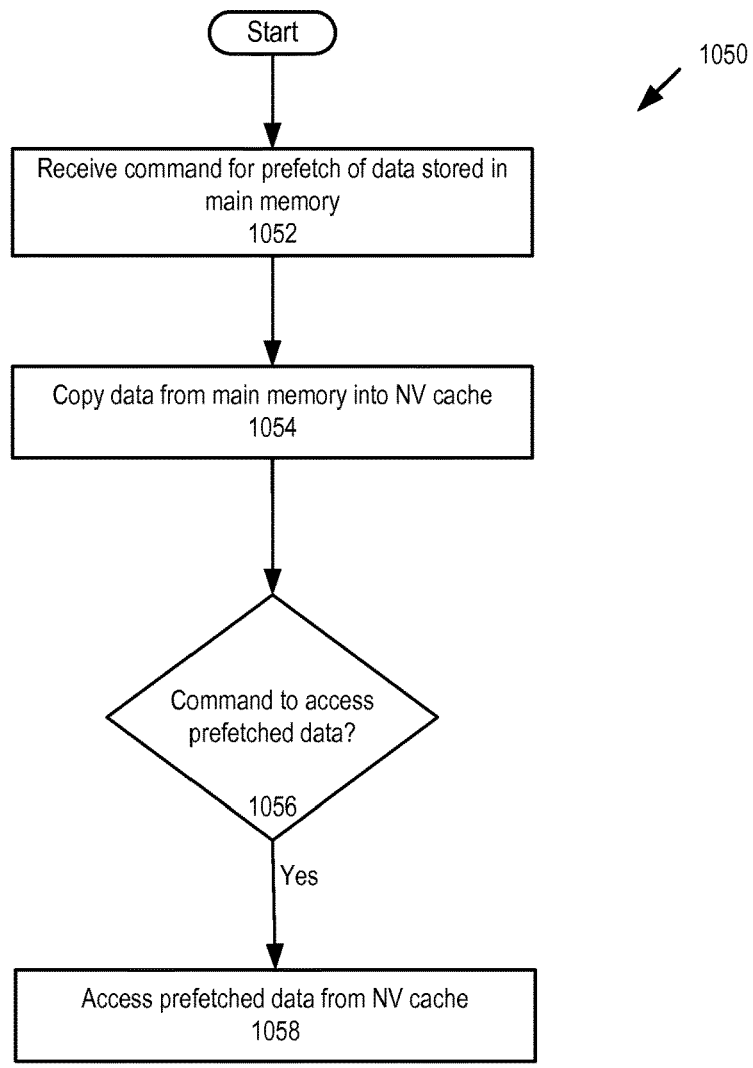
FIG. 10B illustrates a flow chart of an example of the memory system managing a prefetch operation for the NV cache.

FIG. 10B illustrates a flow chart 1050 of an example of the memory system 102 managing a prefetch operation for the NV cache. At 1052, the memory system 102 receives a command to prefetch data stored in the main memory. At 1054, the memory system 102 copies the data from main memory into the NV cache. At 1056, the memory system 102 determines whether a command to access the prefetched data has been received. If so, at 1058, the memory device accesses the prefetched data from the NV cache.

As discussed above, the host system may send a command to indicate the size of the NV cache. For example, the host system may send a command that indicates the number of cache units as the size of the NV cache. More specifically, NV_Cache_Size command may include a parameter that indicates the size of the NV cache in units of NV cache unit size, as discussed above.

In one embodiment, in response to receiving the host system command indicating the size of the cache, the memory system may allocate memory to the NV cache to equal the size as dictated by the host system command. For example, if the host system indicates that the NV cache be 10 units of the NV cache unit size, the memory system may allocate memory to equal 10 units of the NV cache unit size. In an alternate embodiment, under certain circumstances, the memory system may allocate memory to the NV cache to be greater than the size as dictated by the host system command. For example, if the host system indicates that the NV cache be 10 units of the NV cache unit size, the memory system may allocate memory to equal 20 units of the NV cache unit size. In still an alternate embodiment, the memory system may allocate memory to the NV cache to be less than the size as dictated by the host system command. For example, if the host system indicates that the NV cache be 10 units of the NV cache unit size, the memory system may allocate memory to equal 4 units of the NV cache unit size. In yet another alternate embodiment, the memory system may initially allocate memory to the NV cache to be greater than the size as dictated by the host system command, and during operation of the memory system may decrease the memory allocated to the NV cache (e.g., decrease the allocated memory until it is equal to the size as dictated by the host system command, and thereafter decrease even further the allocated memory until it is less than the size as dictated by the host system command). For example, if the host system indicates that the NV cache be 10 units of the NV cache unit size, the memory system may initially allocate memory to equal 20 units of the NV cache unit size, and over time, due to filling of the main memory or bad blocks, reducing the allocated memory to equal 10 units of the NV cache unit size, and thereafter reducing the allocated memory to be less than 10 units of the NV cache unit size.

Figure 11A:
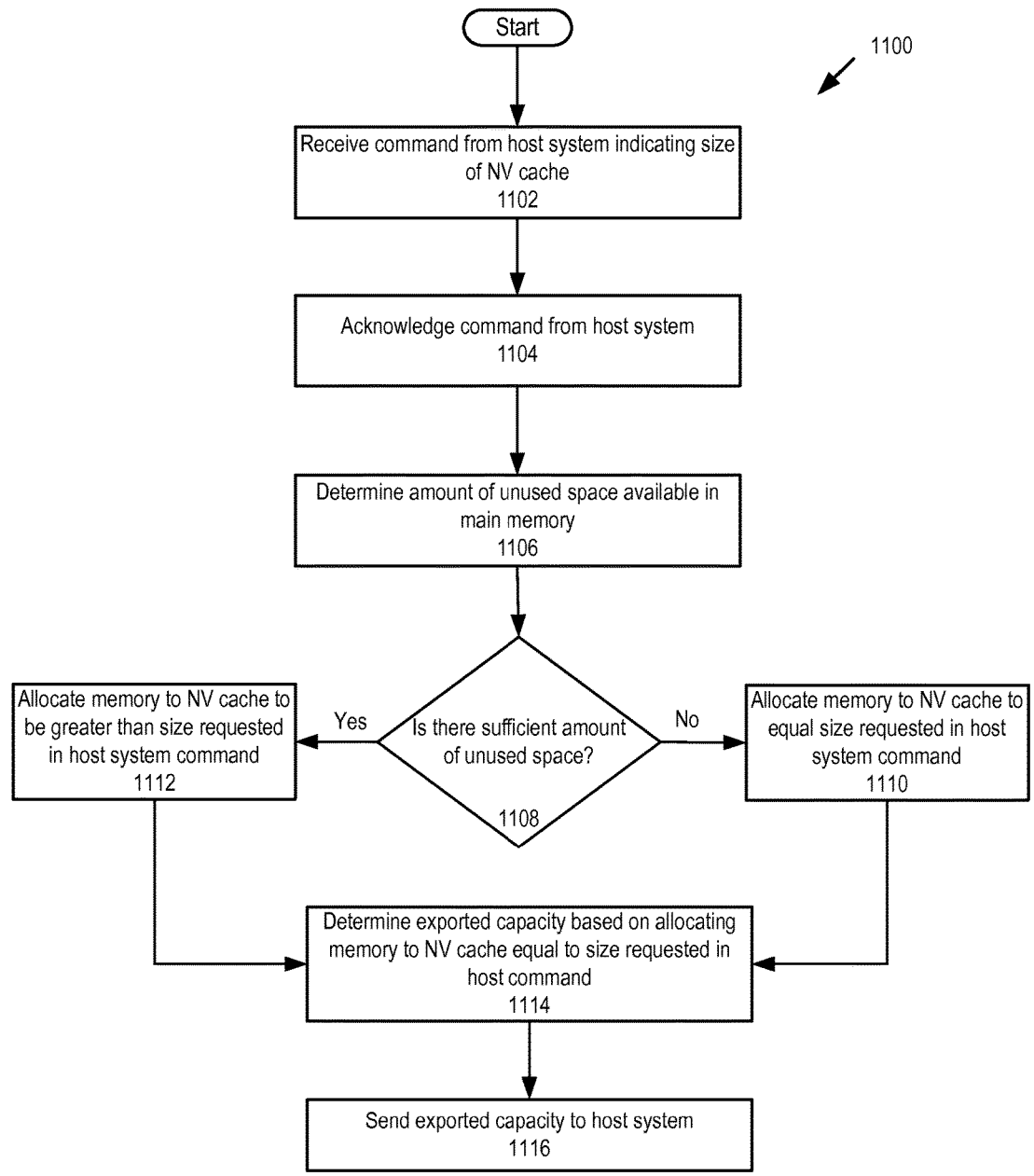
FIG. 11A illustrates a flow chart of an example of the memory system overprovisioning the size of the NV cache.

FIG. 11A illustrates a flow chart 1100 of an example of the memory system overprovisioning the size of the NV cache. At 1102, the memory system receives a command from the host system indicating the size of the NV cache. At 1104, optionally, the memory system may acknowledge receipt of the command from the host system. At 1106, the memory system may determine the amount of unused space in the main memory. For example, if the memory system is newer and does not have much data stored in the main memory, much of the main memory is unused.

At 1108, the memory system may determine if there is a sufficient amount of unused space. For example, the memory system may compare the amount of unused space to a predetermined threshold. In response to determining that the memory system does not have a sufficient amount of unused space, at 1110, the memory system may allocate memory to NV cache to equal size requested in host system command. In response to determining that the memory system does have a sufficient amount of unused space, at 1112, the memory system may allocate memory to NV cache to be greater than the size requested in host system command. Thus, at 1112, the memory system overprovisions memory to the NV cache. At 1114, the memory system may determine the total amount of storage, given the amount allocated to NV cache, in order to send the exported capacity to the host system. As illustrated in FIG. 11A, the exported capacity to the host will be the same whether the memory system overprovisions to the NV cache or provisions equal to the host system command.

Figure 11B:
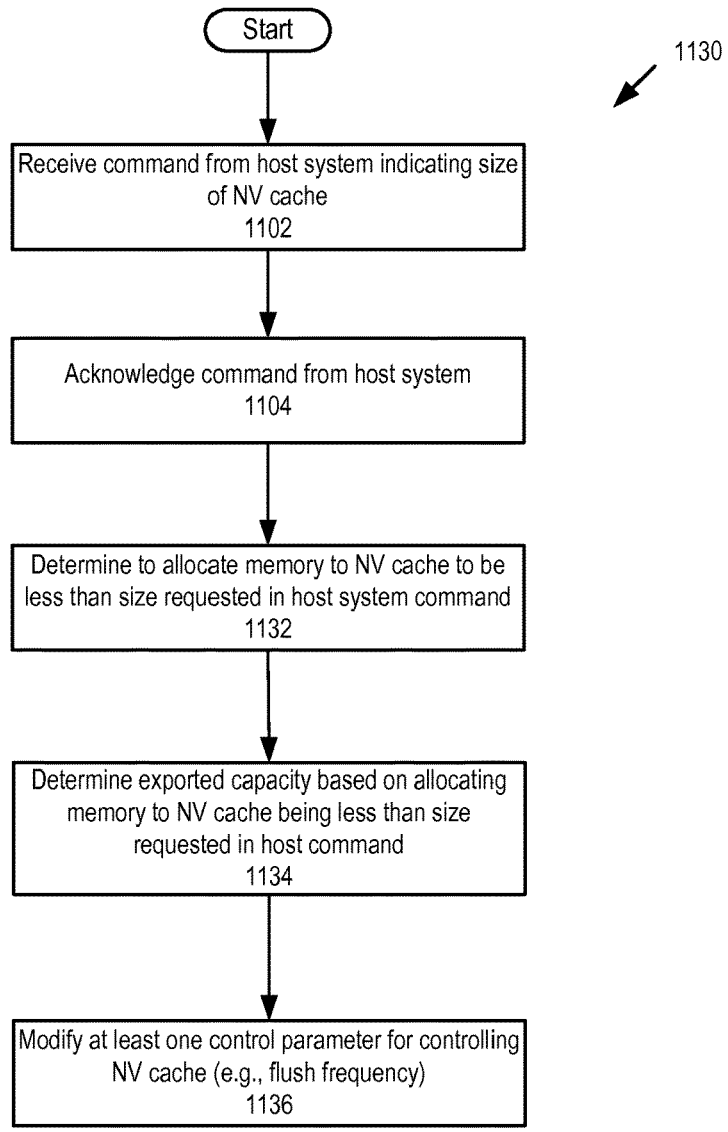
FIG. 11B illustrates a flow chart of an example of the memory system underprovisioning the size of the NV cache.

FIG. 11B illustrates a flow chart 1130 of an example of the memory system underprovisioning the size of the NV cache. Unlike FIG. 11A, FIG. 11B at 1132 determines to allocate memory to NV cache to be less than the size requested in the host system command. Further, at 1134, the memory system may determine the exported capacity, not based on the NV cache as requested in the host command, but based on the underprovisioned amount allocated to the NV cache. In this regard, due to the underprovisioning, the exported capacity is greater than if the NV cache were sized as requested by the host system. At 1136, the memory system may modify at least one control parameter for controlling the NV cache, such as the frequency of flushing the NV cache. More specifically, due to the smaller size of the NV cache, the memory system may more frequently flush data from the NV cache, such as during idle time, so that the NV cache may have sufficient space to accept data.

Figure 11C:
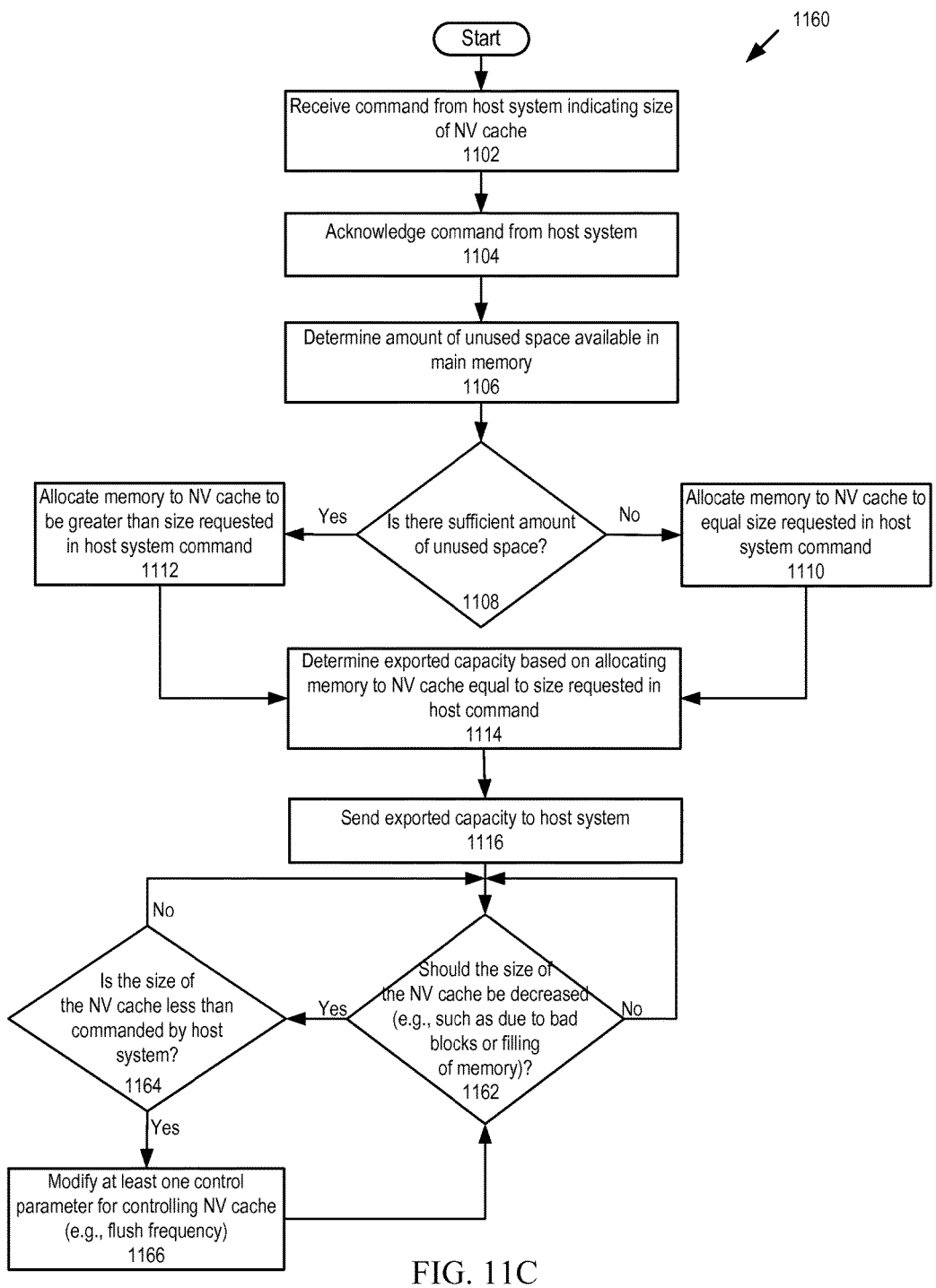
FIG. 11C illustrates a flow chart of an example of the memory system overprovisioning the size of the NV cache, and then decreasing the size of the NV cache.

FIG. 11C illustrates a flow chart 1160 of an example of the memory system overprovisioning the size of the NV cache, and then decreasing the size of the NV cache. After the overprovisioning is performed, see 1102 to 1116, thereafter, the memory system may determine to decrease the overprovisioned NV cache. At 1162, it is determined whether the size of the NV cache should be decreased. Reasons for decreasing the NV cache may include, but not be limited to: bad or unusable blocks in the main memory; a decreasing amount of free space in the main memory. In other words, in order to maintain the exported capacity as previously reported to the host system, and due to less space available for writing in the main memory, the memory system may reduce the allocation of memory to the NV cache. In response to determining that the size of the NV cache should be decreased, at 1164, it is determined whether the size of the NV cache is less than commanded by the host system. If so, at 1166, at least one control parameter, such as the frequency of flushing, is modified. In the example of overprovisioning given above, the host system requests 10 cache units. Initially, the memory system allocates 20 cache units to the NV cache. Over time, the memory system may reduce the size of the NV cache until the NV cache is equal to 10 units (the same as what the host system commanded). Even later, due to bad blocks or the like, the memory system may further reduce the size of the NV cache, thereby underprovisioning the NV cache. Further, exported capacity may remain the same throughout the memory system changing of the size of the NV cache.

Separate from controlling the configuration and/or operation of the cache, the host system may configure or control other aspects of the memory system. In one embodiment, the host system may command the memory system to perform one or more operations in the idle time of the memory system. For example, the host system may command the memory system, in its idle time, to read data from its main storage, determine whether there are potential errors in the data, and in response to determining that there are potential errors in the data, refresh the data by copying the data to another section in memory. In effect, the host system may command the memory system to perform a read scrub. In response to receipt of the command, the memory system, when idle, read data from its main memory. The data may be analyzed using an ECC engine to determine a bit error rate (BER). In response to the BER being above a predetermined threshold, the memory system may determine to refresh the data by copying the data to a new section of memory (e.g., copy data from a first block to a second block of memory) and then erasing original section of memory (e.g., erase the first block). An example of a command to perform a read scrub is as follows:

HIRR_START_STOP (R/W) (EXT_CSD[XXX])

Further, the host system may command the memory system to provide an indication of how much of the main storage is refreshed. The indication may comprise a percentage (%) of the main storage that the memory system has read, analyzed with the ECC engine, and in response to determining a high BER, refreshed the data. An example of a command to provide an indication of how much of the main storage is refreshed is as follows:

HIRR_STATUS (R) (EXT_CSD[xxx]) (return the % of completed media refreshed)

Thus, in one embodiment, a memory device is disclosed. The memory device comprises: an interface configured to communicate with a host device; a non-volatile memory; and processor circuitry in communication with the interface and the non-volatile memory. The processor circuitry includes: a poll response module configured to generate a response to a non-volatile cache poll received via the interface from the host device; and a non-volatile cache control module configured to control a non-volatile cache in the non-volatile memory based on a non-volatile cache command received via the interface from the host device. In one aspect, the non-volatile cache control module is configured to receive a non-volatile cache configuration command and to configure the non-volatile cache based on the non-volatile cache configuration command. More specifically, the non-volatile cache configuration command comprises a size of the non-volatile cache, and the non-volatile cache control module is configured to size the non-volatile cache based on the size in the command. In another aspect, the non-volatile cache control module is configured to receive a selective flush command and to selectively flush the non-volatile cache such that, after execution of the command, the non-volatile cache retains at least a part of the data. The selective flush command includes at least one identifying aspect, and the non-volatile cache control module is configured to selectively remove entries in the non-volatile cache that match the at least one identifying aspect. For example, the at least one identifying aspect comprises an address, and the non-volatile cache control module is configured to remove entries in the non-volatile cache that match the address.

The instructions may be embodied in a computer-readable medium. The computer-readable medium may be a single medium, or the computer-readable medium may be a single medium or multiple media, such as a centralized or distributed database, and/or associated caches and servers that store one or more sets of instructions. The term "computer-readable medium" may also include any medium that may be capable of storing, encoding or carrying a set of instructions for execution by a processor or that may cause a computer system to perform any one or more of the methods or operations disclosed herein.

The computer-readable medium may include a solid-state memory such as a memory card or other package that houses one or more non-volatile read-only memories. The computer-readable medium also may be a random access memory or other volatile re-writable memory. Additionally, the computer-readable medium may include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that may be a tangible storage medium. The computer-readable medium is preferably a tangible storage medium. Accordingly, the disclosure may be considered to include any one or more of a computer-readable medium or a distribution medium and other equivalents and successor media, in which data or instructions may be stored.

Alternatively or in addition, dedicated hardware implementations, such as application specific integrated circuits, programmable logic arrays and other hardware devices, may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system may encompass software, firmware, and hardware implementations.

The illustrations described herein are intended to provide a general understanding of the structure of various embodiments. The illustrations are not intended to serve as a complete description of all of the elements and features of apparatus, processors, and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

The above disclosed subject matter is to be considered illustrative, and not restrictive, and the appended claims are intended to cover all such modifications, enhancements, and other embodiments, which fall within the true spirit and scope of the description. Thus, to the maximum extent allowed by law, the scope is to be determined by the broadest permissible interpretation of the following claims and their equivalents, and shall not be restricted or limited by the foregoing detailed description.

What is claimed is:

1. A storage device comprising:
    a memory comprising a non-volatile cache and a non-volatile storage medium; and
    a controller in communication with the memory, the controller configured to:
        receive, from a host system, a host system cache command, the host system cache command comprising a command to the storage device containing one or more cache criteria for configuring or controlling the non-volatile cache, the one or more cache criteria being generated by the host system and responsive to analysis by the host system of the memory in the storage device;
        receive host data in host data commands;
        control operation of the non-volatile cache with respect to handling host data received in the host data commands according to the one or more cache criteria contained in the host system cache command;
        control operation of the non-volatile storage medium according to storage medium criteria,
        wherein the one or more cache criteria is different from the storage medium criteria;
        program cells in the non-volatile cache according to a first TRIM set; and
        program cells in the non-volatile storage medium according to a second TRIM set,
        wherein the first TRIM set includes at least one TRIM parameter and the second TRIM set includes at least one other TRIM parameter different from the at least one TRIM parameter of the first TRIM set, and wherein the cells in the non-volatile cache are programmed according to the at least one TRIM parameter of the first TRIM set and the cells in the non-volatile storage medium are programmed according to the at least one other TRIM parameter of the second TRIM set.

2. The storage device of claim 1, wherein the controller is configured to program cells in the non-volatile cache to a first number of bits per cell;
    wherein the controller is further configured to program cells in the storage medium to a second number of bits per cell; and
    wherein the first number of bits per cell is different from the second number of bits per cell.

3. The storage device of claim 2, wherein the controller is configured to program the cells in the non-volatile cache for single-level cells; and
    wherein the controller is configured to program the cells in the non-volatile storage medium for multi-level cells.

4. The storage device of claim 1, wherein the at least one TRIM parameter of the first TRIM set includes at least one of a program voltage, a set-up voltage, and a program pulse width.

5. The storage device of claim 1, wherein the controller is configured to use the host system cache command to configure the non-volatile cache.

6. The storage device of claim 5, wherein the controller is configured to program a respective memory cell in the non-volatile storage medium to store multiple bits;
    wherein the host system cache command comprises an indication that at least a part of the non-volatile cache is single-level cell; and
    wherein, in response to receipt of the host system cache command, the cache operation circuitry is configured to program a respective memory cell in the non-volatile cache to store a single bit.

7. The storage device of claim 4, wherein the memory comprises a plurality of dies, each of the dies comprising a plurality of blocks;
   wherein the non-volatile cache is allocated to a first portion of a block in each of the plurality of dies, the first portion being less than an entire respective block;
   wherein a second portion of block comprising a remainder of the block is allocated to the non-volatile storage medium;
   wherein programming of the first portion of the block is according to the first TRIM set; and
   wherein programming of the second portion of the block is according to the second TRIM set.

8. A method comprising:
   receiving, at a storage device having a controller in communication with a memory comprising a non-volatile cache and a non-volatile storage medium, a host system cache command from a host system to configure a non-volatile cache, the host system cache command comprising a command to a storage device containing one or more cache criteria for configuring or controlling the non-volatile cache, the one or more cache criteria being generated by the host system and responsive to analysis by the host system of the memory in the storage device;
   updating, by the storage device, non-volatile cache criteria with the one or more cache criteria;
   controlling the non-volatile cache according to the non-volatile cache criteria;
   controlling the non-volatile storage medium according to storage medium criteria,
   wherein the non-volatile cache criteria is different from the storage medium criteria;
   programming cells in the non-volatile cache according to a first TRIM set; and
   programming cells in the non-volatile storage medium according to a second TRIM set,
   wherein the first TRIM set includes at least one TRIM parameter and the second TRIM set includes at least one other TRIM parameter different from the at least one TRIM parameter of the first TRIM set, and wherein the cells in the non-volatile cache are programmed according to the at least one TRIM parameter of the first TRIM set and the cells in the non-volatile storage medium are programmed according to the at least one other TRIM parameter of the second TRIM set.

9. The method of claim 8, wherein the one or more cache criteria comprises a first number of bits per cell;
   wherein programming cells in the non-volatile cache is according to the first number of bits per cell;
   wherein programming cells in the storage medium is according to a second number of bits per cell; and
   wherein the first number of bits per cell is different from the second number of bits per cell.

10. The method of claim 9, wherein programming the cells in the non-volatile cache is for single-level cells; and
   wherein programming the cells in the storage medium for multi-level cells.

11. The method of claim 8, wherein the at least one TRIM parameter of the first TRIM set includes at least one of a program voltage, a set-up voltage, and a program pulse width.

12. The method of claim 8, wherein programming a respective memory cell in the non-volatile storage medium stores multiple bits;
   wherein the one or more cache criteria in the host system cache command comprises an indication that at least a part of the non-volatile cache is single-level cell; and
   wherein, in response to receipt of the host system cache command:
   the non-volatile storage cache criteria is updated with the indication that at least a part of the non-volatile cache is single-level cell; and
   the programming of a respective memory cell in the non-volatile cache is to store a single bit.

13. The method of claim 8, wherein the non-volatile cache is allocated to an entire one or more blocks in the memory.

14. The method of claim 8, wherein the memory comprises a plurality of dies, each of the dies comprising a plurality of blocks;
   wherein the non-volatile cache is allocated to a first portion of a block in each of the plurality of dies, the first portion being less than an entire respective block; and
   wherein a second portion of block comprising a remainder of the block is allocated to the non-volatile storage medium.

15. The storage device of claim 1, wherein the one or more cache criteria in the host system control command comprises fullness criteria; and
   wherein the controller is configured to use the fullness criteria to determine a fullness of the non-volatile cache.

16. The storage device of claim 1, wherein the host system cache command comprises a host system control command configured to control operation of the non-volatile cache; and
   wherein, the controller is configured to modify operation of the cache based on the host system control command.

17. The storage device of claim 16, wherein the non-volatile storage medium comprises main memory; and
   wherein the host system control command is indicative to the controller to bypass the non-volatile cache and to program data in the main memory.

18. A storage device comprising:
   a memory comprising a non-volatile cache and a non-volatile storage medium;
   means for receiving a host system cache command from a host system, the host system cache command comprising a command to the storage device identifying to use a cache programming operation for programming the cache, the cache programming operation being generated by the host system and responsive to analysis by the host system of the memory in the storage device;
   means for controlling the non-volatile cache according to the cache programming operation; and
   means for controlling the non-volatile storage medium according to a storage medium programming operation;
   means for programming cells of the non-volatile cache according to a first TRIM set; and
   means for programming cells of the non-volatile storage medium according to a second TRIM set,
   wherein the cache controlling operation is different from the storage medium controlling operation,
   wherein at least one block comprises a first portion for non-volatile cache and a second portion for non-volatile storage medium,
   wherein the first TRIM set includes at least one TRIM parameter and the second TRIM set includes at least one other TRIM parameter different from the at least one TRIM parameter of the first TRIM set, and wherein the cells in the non-volatile cache are programmed according to the at least one TRIM parameter of the first TRIM set and the cells in the non-volatile storage medium are programmed according to the at least one other TRIM parameter of the second TRIM set.

19. A storage device comprising:

a memory comprising a non-volatile cache and a non-volatile storage medium; and a controller in communication with the memory, the controller configured to:

receive, from a host system, a host system cache command, the host system cache command comprising a command to the storage device containing one or more cache criteria for configuring or controlling the non-volatile cache, the one or more cache criteria being generated by the host system and responsive to analysis by the host system of the memory in the storage device;

receive host data in host data commands;

control operation of the non-volatile cache with respect to handling host data received in the host data commands according to the one or more cache criteria contained in the host system cache command;

control operation of the non-volatile storage medium according to storage medium criteria, wherein the one or more cache criteria is different from the storage medium criteria;

program cells in the non-volatile cache according to a first TRIM set; and program cells in the non-volatile storage medium according to a second TRIM set, wherein the first TRIM set includes at least one TRIM parameter and the second TRIM set includes at least one other TRIM parameter different from the at least one TRIM parameter of the first TRIM set, and wherein the cells in the non-volatile cache are programmed according to the at least one TRIM parameter of the first TRIM set at a first rate and the cells in the non-volatile storage medium are programmed according to the at least one other TRIM parameter of the second TRIM set at a second rate different from the first rate.

* * * * *